(12) United States Patent
Kosaki et al.

(10) Patent No.: US 7,981,744 B2
(45) Date of Patent: Jul. 19, 2011

(54) FIELD-EFFECT TRANSISTOR, SEMICONDUCTOR DEVICE, A METHOD FOR MANUFACTURING THEM, AND A METHOD OF SEMICONDUCTOR CRYSTAL GROWTH

(75) Inventors: Masayoshi Kosaki, Aichi (JP); Koji Hirata, Aichi (JP); Masanobu Senda, Aichi (JP); Naoki Shibata, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 1038 days.

(21) Appl. No.: 11/578,965

(22) PCT Filed: Jun. 9, 2005

(86) PCT No.: PCT/JP2005/011006
§ 371 (c)(1),
(2), (4) Date: Jul. 2, 2007

(87) PCT Pub. No.: WO2005/122234
PCT Pub. Date: Dec. 22, 2005

(65) Prior Publication Data
US 2007/0278532 A1   Dec. 6, 2007

(30) Foreign Application Priority Data

Jun. 10, 2004 (JP) ................................. 2004-172495
Jun. 15, 2004 (JP) ................................. 2004-176675
Jun. 15, 2004 (JP) ................................. 2004-176676

(51) Int. Cl.
*H01L 21/336* (2006.01)
*H01L 21/3205* (2006.01)

(52) U.S. Cl. ........................ 438/258; 438/590

(58) Field of Classification Search .......... 438/258–293, 438/590–591, E29.25–E29.252
See application file for complete search history.

(56) References Cited

U.S. PATENT DOCUMENTS

| 2002/0167023 A1 | 11/2002 | Chavarkar et al. |
| 2003/0102482 A1 | 6/2003 | Saxler |
| 2006/0121682 A1 | 6/2006 | Saxler |

FOREIGN PATENT DOCUMENTS

| JP | 08-088432 | 4/1996 |
| JP | 09-139543 | 5/1997 |
| JP | 11-068159 | 3/1999 |
| JP | 2002-016087 | 1/2002 |
| JP | 2002-057158 | 2/2002 |
| JP | 2003-045899 | 2/2003 |

(Continued)

OTHER PUBLICATIONS

Translated Chinese Office Action dated Apr. 18, 2008.

(Continued)

*Primary Examiner* — Cuong Q Nguyen
(74) *Attorney, Agent, or Firm* — McGinn IP Law Group, PLLC

(57) ABSTRACT

A field-effect transistor which comprises a buffer layer and a barrier layer each of which is made of a Group III nitride compound semiconductor and has a channel at the interface inside of the buffer layer to the barrier layer, wherein the barrier layer has multiple-layer structure comprising an abruct interface providing layer which composes the lowest semiconductor layer in said barrier layer and whose composition varies rapidly at the interface of said buffer layer, and an electrode connection plane providing layer which constructs the uppermost semiconductor layer and whose upper surface is formed flat.

3 Claims, 18 Drawing Sheets

Region $r_1 \geq R \geq r_2$

FOREIGN PATENT DOCUMENTS

| | | |
|---|---|---|
| JP | 2003-151996 | 5/2003 |
| JP | 2003-277196 | 10/2003 |
| JP | 2005-512327 | 4/2005 |
| WO | WO 03/049193 A1 | 6/2003 |

OTHER PUBLICATIONS

Lu, W., et al., "Cyclotron resonance and magnetotransport mearsurements in AlxGa1-xzN/GaN heterostructures for x=0.15-0.30", Applied Physics Letters, vol. 80, No. 3, Jan. 21, 2002, pp. 431-433.

Y. H. Jeong, et al., "Enhancement of the Electrical Properties of AlGaN/GaN HFETs by Using Undoped Semi-Insulating GaN", Journal of the Korean Physical Society, Jan. 2004, vol. 44, No. 1, pp. 140-143.

H. X. Wang, et al., "Influence of Carrier gas on the Morphology and Structure of GaN Layers Grown on Sapphire Substrate by Six-Wafer Metal Organic Chemical Vapor Deposition System", Journal of Crystal Growth, 2001, vol. 233, pp. 681-686.

English translation of the German Office Action dated Aug. 11, 2009.

Wang, et al. "Influence of carrier gas on the morphology and structure of GaN layers grown on sapphire substrate by six-wafer metal organic chemical vapor deposition system", in Journal of Crystal Growth, 2001, vol. 233, pp. 681-686.

Figure 1. Region $r_1 \geq R \geq r_2$

FIG. 6
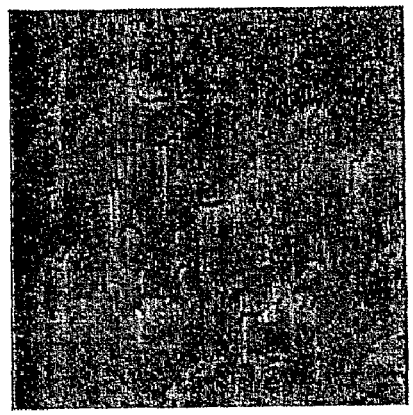
$d_2 = 30$ nm
2μm × 2μm
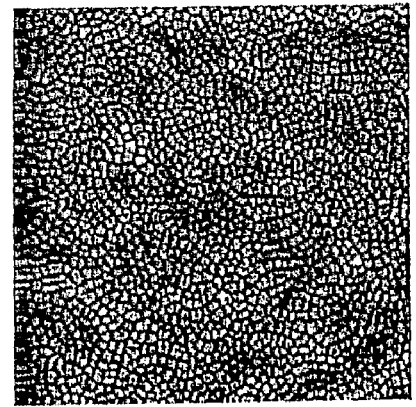
$d_2 = 0$ nm

FIG. 11

| | | | TRANSISTOR 10 | TRANSISTOR 100 |
|---|---|---|---|---|
| CRYSTAL GROWTH CONDITION | LAYER A | Al COMPOSITION RATIO $x$ | 0.00 | 0.00 |
| | | THICKNESS $D_A$ | 2 [μm] | 2 [μm] |
| | | GROWTH TEMPERATURE $T_A$ | 1050 [°C] | 1100 [°C] |
| | | PRESSURE $P_A$ | 1013 [hPa] | 1013 [hPa] |
| | LAYER B | Al COMPOSITION RATIO $y$ | 0.25 | 0.25 |
| | | THICKNESS $d_B$ | 35 [nm] | 35 [nm] |
| | | GROWTH TEMPERATURE $T_B$ | 1150 [°C] | 1000 [°C] |
| | | PRESSURE $P_B$ | 900 [hPa] | 1013 [hPa] |
| CHARACTERISTIC | | ON-STATE ELECTRIC CURRENT $I$ | 0.7 [A/mm] | 1.0 [A/mm] |
| | | SHEET RESISTIVITY $\rho$ | 650 [Ω/□] | 450 [Ω/□] |
| | | MOBILITY $\mu$ | 1000 [cm²/V·sec] | 1500 [cm²/V·sec] |

| V/III RATIO | COMPOSITION RATIO OF CRYSTAL MATERIAL GAS | GROWTH RATE (Å/min) | LEAK ELECTRIC CURRENT (A) |
|---|---|---|---|
| 1473 | 1.0 | 659 | 1.01E-08 |
| 1473 | 1.1 | 827 | 2.43E-10 |
| 1473 | 1.2 | 968 | 2.14E-11 |

FIELD-EFFECT TRANSISTOR, SEMICONDUCTOR DEVICE, A METHOD FOR MANUFACTURING THEM, AND A METHOD OF SEMICONDUCTOR CRYSTAL GROWTH

FIELD OF THE INVENTION

The present invention relates to structure of a field-effect transistor (e.g.: various kinds of FET and HEMT) which can be manufactured through crystal growth of a Group III nitride compound semiconductor and a method for manufacturing the field-effect transistor.

The present invention also relates to structure of a field-effect transistor (e.g.: various kinds of FET and HEMT) which can be manufactured through crystal growth of a Group III nitride compound semiconductor and a method for manufacturing the field-effect transistor.

Further, the present invention relates to a method for crystal growing a semiconductor with high insulation and a semiconductor device comprising the semiconductor.

The present invention is useful for manufacturing a device such as a field-effect transistor.

DISCLOSURE OF THE PRESENT INVENTION

Generally, as structure of a field-effect transistor which can be manufactured through crystal growth of a Group III nitride compound semiconductor and a method for manufacturing it, a conventional technique disclosed in a patent document 1, for example, has been well-known widely.

In the conventional inventions, hydrogen ($H_2$) gas is often used as a carrier gas which carries material gas in a process of crystal growing a semiconductor layer.

The reasons are as follows.

(Reason 1) Using hydrogen gas enables to provide a semiconductor layer formed through crystal growth with excellent crystallinity comparatively easier than using other carrier gas. That is advantageous to sheet resistance of the device, varying device characteristic, and yield of the device.

(Reason 2) By employing hydrogen gas, it becomes easier to improve flatness of an interface between each semiconductor layer such as a buffer layer and a barrier layer or to improve rapidity of composing variation around the interface compared with a device which employs other carrier gas. That enables to obtain and maintain excellent mobility of carriers which shift comparatively easier, and that is advantageous to miniaturize and to improve performance of the device.

[Patent Document 1] Japanese Laid-open patent application 2003-45899

FIG. 12 illustrates a sectional view of a conventional field-effect transistor 10. The field-effect transistor 10 is a semiconductor device which is manufactured by depositing Group III nitride compound semiconductors in sequence through crystal growth, and has about 0.3 μm in thickness of AlN buffer layer 2 formed on about 500 μm in thickness of silicon carbide (SiC) crystal growth substrate 1.

About 2 μm in thickness of undoped GaN semiconductor layer 3 is formed on the buffer layer 2, and about 35 nm in thickness of undoped $Al_{0.25}Ga_{0.75}N$ semiconductor layer 4 is formed thereon. Signs 5, 6, and 7 represent a source electrode, a gate electrode, and a drain electrode, respectively.

Because the semiconductor layer 3 and the semiconductor layer 4 have different semiconductor crystal components with each other, crystal growth conditions for providing optimum crystal qualities are different with each other. Especially, growth conditions such as crystal growth temperature and pressure (that is, partial pressure or total pressure of each gas) are important. For example, in a process of crystal growing an AlGaN, crystal growth temperature for optimum crystal quality generally becomes larger as aluminum composition ratio becomes larger.

Accordingly, with respect to the above-described semiconductor layer 3, for example, the optimum crystal growth temperature is about 1050° C., and with respect to the semiconductor layer 4, the optimum crystal growth temperature is about 1150° C., which is higher than that of the semiconductor layer 3 by 100° C.

Generally, crystal growth pressure (total pressure) of the AlGaN semiconductor layer 4 was smaller than that of the GaN semiconductor layer 3 in order to equalize Al composition ratio in the semiconductor layer 4.

As other conventional field-effect transistor, the following patent documents 2-5 show other concrete examples.

[Patent document 2] Japanese Laid-open patent application 2002-57158

[Patent document 3] Japanese Laid-open patent application 2003-45899

[Patent document 4] Japanese Laid-open patent application 2002-16087

[Patent document 5] Japanese Laid-open patent application 2003-277196

Further, as a conventional field-effect transistor, for example, a semiconductor device such as HEMT which uses a undoped GaN layer as a channel layer has been known. Such conventional device, however, comprises an undesirable conductive layer which is formed around the interface existing above a nucleus forming layer (that is, a lattice constant difference relaxing layer). When such a conductive layer is formed in a device, break down field strength of the device may be deteriorated, which is not desirable.

In order to solve that problem, a field-effect transistor shown in the patent document 6 listed below has been invented. The field-effect transistor comprises a buffer layer which is formed on a nucleus forming layer by doping a IIB Group impurity such as Zn, the buffer layer being a semiconductor layer with high resistivity which hardly scatters impurities into a channel layer. That enables the field-effect transistor to isolate devices electrically and to improve break down field strength.

As the semiconductor layer with high resistivity employed in a power HFET, for example, an undoped GaN layer shown in the non-patent document 1 listed below has been well-known. The undoped GaN layer is deposited at crystal growth temperature of 1050° C. to have a thickness of 2 μm, and it has been reported that the GaN layer may have a sheet resistivity of more than $100 M\Omega/cm^2$ (resistivity: $2 \times 10^4$ Ωcm).

[Patent document 6] Japanese Laid-open patent application 2002-57158

[Non-patent document 1] Seikoh YOSHIDA, "AlGaN/GaN Power FET" Furukawa Electric Review, No. 109, January, 2002

Problems To Be Solved

By employing hydrogen ($H_2$) gas as carrier gas, however, surface of the uppermost semiconductor layer may hardly be formed flat or smooth, which generates the following problems.

(Problem 1) When undulations of roughness of the surface of the semiconductor layer become relatively too large toward the size of the electrode to be connected, it becomes difficult to form the electrode on that rugged surface. As a result, miniaturization of the electrode is prevented and the device can hardly be formed smaller.

(Problem 2) Even when the electrode is formed at the predetermined position, electric characteristics such as connection strength and ohmic characteristic cannot become sufficiently stable. It becomes difficult to maintain yield of the device, and, as a result, industrial mass production of the objective field-effect transistors can hardly be provided.

Reasons why the surface on the semiconductor layer becomes rough as described above may be because of etching treatment using hydrogen ($H_2$) gas. Accordingly, in order to overcome this problem, other element such as nitrogen ($N_2$) can be employed as carrier gas to form a buffer layer through crystal growth, which results in improving the roughness on the surface of the semiconductor layer. By employing this process, however, both of the desired electric characteristics such as mobility and sheet resistivity according to the above-described reasons 1 and 2 can hardly be obtained at the same time.

When crystal growth condition which emphasizes crystal quality of each semiconductor layer (3 and 4) shown in FIG. 12 is employed, high crystal quality in each semiconductor layer can be maintained. By employing such crystal growth condition, however, deposition condition around interfaces of those two semiconductor layers (3 and 4) tends to be turbulent. In short, the interface between those two layers becomes rough. That may be because atoms which once construct the upper surface of the semiconductor layer 3 are sublimed according to variation of crystal growth condition between those two layers.

Such deterioration of crystalinity tends to occur owing to etching by carrier gas. That may be easily understood by the following documents.

(1) Japanese Laid-open patent application H11-068159
(2) Japanese Laid-open patent application H9-139543
(3) Japanese Laid-open patent application H8-88432

Such roughness of interface tends to decrease mobility of carriers confined on the channel which construct quasi-two-dimensional electric gas and decrease electric current. As a result, device characteristic is deteriorated.

Further, when a semiconductor layer is doped with impurity of high conductivity, it is not always easy to deposit an undoped layer with adequately low impurity concentration after forming the high impurity doped semiconductor. That is because impurities are left in the crystal growth furnace or impurities defuse in each of the deposited semiconductor layer.

When such impurities are mixed into the semiconductor layer at which a channel is to be formed, it becomes difficult to form a channel having high mobility. That is because impurities in the semiconductor layer for forming the channel scatter carriers which are moving.

On the contrary, in order to manufacture a semiconductor device with high break down field strength, about 100 $M\Omega/cm^2$ of sheet resistivity may not be sufficient. Accordingly, conventional technique as shown in the non-patent document 1 can hardly crystal grow a semiconductor having insulation which is high enough to meet higher performance required these days. Moreover, the non-patent document 1 never suggests to overcome that problem.

The present invention has been accomplished in order to overcome the aforementioned drawbacks. Thus, an object of the present invention is to produce a field-effect transistor which has excellent sheet resistivity, certainty of forming fine electrode and high mobility of carrier and is optimum to high performance and minimization of the device.

Another object of the present invention is to produce a field-effect transistor which improves mobility of carriers passing through a channel, to thereby improve device characteristic.

Another object of the present invention is to form an undoped semiconductor layer having excellent insulation.

Further, another object of the present invention is to realize a semiconductor device having high mobility of carriers which transmit in a channel and high break down field strength of the device.

Here, each object listed above may be enough to be fulfilled individually by at least one of each invention, and each invention in the present application is not necessarily secure that there is a solution which solves all the problems at once.
Means To Solve The Problems The following means may be useful to overcome the above-described drawbacks.

That is, the first aspect of the present invention provides a field-effect transistor which comprises a buffer layer and a barrier layer each of which is made of a Group III nitride compound semiconductor and has a channel at the interface side of the buffer layer to the barrier layer, comprising at least the following two layers (1) and (2) in total.

(1) An abrupt interface providing layer which composes the lowest semiconductor layer in the barrier layer and whose composition varies rapidly at the interface of the buffer layer (2) An electrode connection plane providing layer which constructs the uppermost semiconductor layer in the barrier layer and whose upper surface is formed flat Generally, the barrier layer is sometimes referred to as a carrier supplying layer, and the buffer layer is sometimes referred to as a base layer. The buffer layer in the first aspect of the present invention does not mean a thin-film semiconductor layer (e.g., about 250 nm in thickness of AlN layer) which is formed between an objective semiconductor layer to be formed through crystal growth and a crystal growth substrate in order to remove or relax difference of lattice constants of those layers in the field of semiconductor crystal growth, but the buffer layer (the base layer) in the first aspect of the present invention may also include such an semiconductor layer.

For example, when a semiconductor growth substrate made of GaN bulk crystal is applied, no problem of difference in lattice constants may exist but the buffer layer (the base layer) explained in the first aspect is needed. Here, the crystal growth substrate made of GaN bulk crystal may function as a buffer layer (base layer) in the first aspect of the present invention.

A drain electrode, a source electrode, and a gate electrode are formed on the uppermost layer of the semiconductor layer. Here, the gate electrode may be formed indirectly through a layer such as an insulation film. Structure of each electrode may be arbitral, and a well-known and proper arbitral structure considering ohmic characteristic and rectification may be selected and employed. The field-effect transistor of the present invention can be any type of field-effect transistor such as a normally-on type transistor and a normally-off type transistor by varying condition like thickness of the barrier layer.

Each condition for forming the optimum structure and the optimum method for producing the field-effect transistor of the present invention is explained hereinafter.

In order to form a channel at which mobility of carrier is large and to optimize ohmic characteristic of the barrier layer around each ohmic electrode, energy level of carriers which are vertical to the barrier layer (that is, band gap of each semiconductor layer) needs to be optimized. And in order to optimize the energy level, at least parameters (1) to (3) as follows are very important.

(1) Thickness of the Semiconductor Layer

Especially, by optimizing a thickness of each semiconductor layer constructing the barrier layer, the barrier layer can be a proper degree of depletion layer and optimum tunneling efficiency of carriers can be obtained in tunneling effect. Further, by optimizing a thickness of each semiconductor layer constructing the barrier layer, gate voltage control toward forming/disappearing the channel can be appropriately maintained. In short, by optimizing a thickness of each semiconductor layer, electron supply can be improved and controlling an electron accumulation layer (channel) becomes easier.

(2) Al Composition Ratio

By optimizing Al composition ratio of each semiconductor layer, band gap energy and electron affinity of each semiconductor layer can be optimized. As a result, excellent channel structure can be obtained.

For example, electron affinity of the barrier layer should not be smaller than electron affinity of the buffer layer. Basically, band gap energy of the barrier layer should be larger than band gap energy of the buffer layers Accordingly, in order to form each of the barrier layer and the buffer layer by using $Al_xGa_{1-x}N$ ($0<x\leq1$), Al composition ratio x of the barrier layer should be larger than Al composition ratio x of the buffer layer. Preferably difference of band gap energies of the barrier layer and the buffer layer may be larger. Al composition ratio of the barrier layer can be a parameter to optimize ohmic characteristic of the barrier layer.

Especially, the semiconductor layer which directly contacts to an ohmic electrode (a source electrode and a drain electrode) can maintain excellent ohmic characteristic by optimizing its Al composition ratio.

(3) Presence or Absence of Impurity

By controlling presence, absence, or concentration of dopants (impurities), carrier concentration, insulation, and ohmic characteristic of each semiconductor can be optimized. In order to achieve high mobility, at least the semiconductor layer which forms the channel or exists around the channel is preferably doped with no impurity to prevent carriers from scattering. Also, the semiconductor layer which is required to have high resistivity may not be doped with any impurity. Thus, at least the semiconductor layer which is the uppermost layer of the buffer layer may preferably be an undoped layer.

The barrier layer may not be necessarily an undoped layer. Alternatively, the barrier layer can be an n-type layer. By applying an n-type barrier layer, the field-effect transistor of the present invention with high quality having actions and effects disclosed in the present invention can be manufactured.

Accordingly, optimizing each parameter is very important.

Each aspect described below has been invented considering each problem listed above. So it is preferable to employ any of the aspects described below in order to carry out the present invention.

That is, the second aspect of the present invention is that each semiconductor layer comprised in the barrier layer in the first aspect is made of an undoped $Al_xGa_{1-x}N$ ($0<x\leq1$)

The third aspect of the present invention is that each semiconductor layer comprised in the barrier layer in the first or second aspect is made of an undoped $Al_xGa_{1-x}N$ ($0.15<x\leq0.3$).

The fourth aspect of the present invention is that aluminum composition ratio x of each semiconductor layer comprised in the second or third aspect decreases substantially monotonously according to the order of deposition.

Here, "decreases substantially monotonously" represents decreasing condition as follows. That is, when a function $z=f(N)$, in which a number N is an independent variable and $N_1$ and $N_2$ are arbitrary numbers to domain of the number N, is represented by a formula "$N_1<N_2 \Rightarrow f(N_1) f \geq (N_2)$," the function f is a monotone decreasing function in a broad sense, and the dependent variable z decreases monotonically to the number N. Accordingly, arranging aluminum composition ratio x of all or a part of respective semiconductor layers consisting the barrier layer to be the same is also included in the fourth aspect of the present invention.

Similarly, when the number N is replaced by a continuous variable such as a time t, the above-described formula can be applied. That is, when a formula "$t_1<t_2 \Rightarrow z_1 f(t_1) \geq z_2 = f(t_2)$" is satisfied with respect to arbitrary time $t_1$ and $t_2$ in a predetermined domain, the dependent variable z similarly decreases monotonically to the independent variable t.

The fifth aspect of the present invention is that the barrier layer in any one of the first to fourth aspects of the present invention comprises a first layer of a barrier layer formed below and a second layer of a barrier layer deposited on the upper surface of the first layer of the barrier layer.

Here, the first layer of the barrier layer is an abrupt interface supplying layer in the present invention, and the second layer of the barrier layer is an electrode connection plane supplying layer in the present invention.

The sixth aspect of the present invention is that thickness $d_1$ of the first layer of the barrier layer and thickness $d_2$ of the second layer of the barrier layer in the fifth aspect are arranged to be $10\,nm \leq d_1 \leq 30\,nm$, $10\,nm \leq d_2 \leq 30\,nm$, and $30\,nm \leq d_1+d_2 \leq 60\,nm$.

The seventh aspect of the present invention is that the uppermost layer of the buffer layer in any one of the first to sixth aspects is made of a undoped GaN. Here, the buffer layer may have single-layer structure. At that time, the buffer layer itself represents the uppermost layer of the buffer layer.

The eighth aspect of the present invention is a method for manufacturing a field-effect transistor which comprises a buffer layer and a barrier layer each of which is made of a Group III nitride compound semiconductor and has a channel at the interface side of the buffer layer to the barrier layer, comprising crystal growth process for crystal growing the barrier layer, wherein a partial pressure ratio R of hydrogen ($H_2$) gas in the carrier gas which carries material gas of the barrier layer decreases substantially continuously or substantially gradually, and substantially monotonously to the time t in a region represented by a formula $r_1 \geq R \geq r_2$ ($1 \geq r_1 > 1/4$, $1/2 > r_2 \geq 0$, $r_1 > r_2$).

More preferably, the partial pressure ratio R of the gas may be decreased substantially continuously or substantially gradually, and substantially monotonously to the time t in the crystal growth process f-or crystal growing the barrier layer in a region represented by a formula $r_1 \geq R \geq r_2$ ($1 \geq r_1 > 1/2$, $1/4 > r_2 \geq 0$).

The ninth aspect of the present invention is that the barrier layer comprises m+l semiconductor layers in total each of which is made of a undoped $Al_xGa_{1-x}N$ ($0<x\leq1$) by decreasing the partial pressure ratio R of the gas gradually for m times ($m \geq 1$) in the eighth aspect of the present invention.

The tenth aspect of the present invention is that the barrier layer in the ninth aspect of the present invention has two-layer structure, comprising a first layer of a barrier layer deposited first, which is grown through crystal growth by using hydrogen ($H_2$) gas as a main carrier gas, and a second layer of a barrier layer deposited thereon, which is grown through crystal growth by using a rare gas or an inert gas comprising nitrogen (N$_2$) gas as a main carrier gas.

Through employment of the aforementioned aspects of the present invention, the aforementioned drawbacks can be overcome effectively and rationally.

The eleventh aspect of the present invention is a method for manufacturing a field-effect transistor which comprises plural semiconductor layers each of which is made of a Group III nitride compound semiconductor through crystal growth, comprising: a first crystal growth process for forming a first semiconductor layer A, on or around the upper interface of which a channel layer is deposited and sublimated; and a second crystal growth process for forming a second semiconductor layer B deposited directly on the first semiconductor layer A, wherein band gap energy E$_B$ of the second semiconductor layer B is larger than band gap energy E$_A$ of the first semiconductor layer A and crystal growth condition of the second semiconductor layer B at least at the early stage of in the second crystal growth process is arranged to be crystal growth condition which restrains sublimation of atoms forming the upper surface of the first semiconductor layer A.

Here, because (an electron gas layer of) the channel layer is formed and removed according to on/off-state of a gate voltage applied to the predetermined gate electrode, the channel layer cannot be an object to be directly handled in the manufacturing process. The electron gas layer of the channel layer is an electron gas layer having a thickness of about 100 Å and is placed around the interface between the first semiconductor layer A and the second semiconductor layer B.

The important parameters which decide crystal growth condition to restrain sublimation of atoms forming the upper surface of the first semiconductor layer A are, for example, crystal growth temperature, partial pressure of each material gas, kinds of carrier gas, partial pressure of each carrier gas, V/III ratio, and crystal growth rate. Especially when atoms which are easily sublimated, e.g., Ga atoms in GaN crystal, are comprised, partial pressure of trymethyl gallium (TMG) are arranged to be relatively or absolutely high.

The twelfth aspect of the present invention is that crystal growth temperature T$_B$ of the second semiconductor layer B is lower than crystal growth temperature T$_A$ of the semiconductor layer A in the eleventh aspect of the present invention.

The thirteenth aspect of the present invention is that crystal growth pressure P$_B$ of the second semiconductor layer B is approximately equal to crystal growth pressure P$_A$ of the first semiconductor layer A in the eleventh or twentieth aspect of the present invention.

The fourteenth aspect of the present invention is that the first semiconductor layer A is made of a binary or ternary undoped Al$_x$Ga$_{1-x}$N (0≦x<1) and that the second semiconductor layer B is made of a ternary undoped Al$_y$Ga$_{1-y}$N (x<y≦1).

The fifteenth aspect of the present invention is that each of the crystal growth temperature T$_A$ and T$_B$ in the fourteenth aspect of the present invention satisfy a formula "950° C.≦T$_B$<T$_A$" where aluminum composition ratio x is approximately 0, aluminum composition ratio y is in a range from 0.15 to 0.30, and each of the crystal growth pressure P$_A$ and P$_B$ is approximately normal pressure.

The sixteenth aspect of the present invention is that the crystal growth temperature T$_A$ of the first semiconductor layer A is 1200° C. or less in any of the eleventh to fifteenth aspects of the present invention.

The seventeenth aspect of the present invention is that the crystal growth temperature T$_A$ of the first semiconductor layer A in any of the eleventh to sixteenth aspects of the present invention is higher than the crystal growth temperature T$_B$ of the second semiconductor layer B by 50° C. or more. Preferable range of this temperature difference may be from 50° C. to 150° C.

The eighteenth aspect of the present invention is that the crystal growth temperature T$_B$ of the second semiconductor layer B in any of the fifteenth to seventeenth aspects of the present invention satisfies a formula "950° C.≦T$_B$<1050° C."

The nineteenth aspect of the present invention is that the crystal growth temperature T$_A$ of the first semiconductor layer A in the eighteenth aspect of the present invention satisfies a formula "1050° C.≦T$_A$<1150° C."

The twentieth aspect of the present invention is a field-effect transistor which comprises plural semiconductor layers each of which is made of a Group III nitride compound semiconductor through crystal growth, comprising: a first semiconductor layer A, on or around the upper interface of which a channel layer is deposited and sublimated; and a second semiconductor layer B deposited directly on the first semiconductor layer A, wherein band gap energy E$_B$ of the second semiconductor layer B is larger than band gap energy E$_A$ of the first semiconductor layer A and the upper surface of the semiconductor layer A is formed substantially flat by restraining sublimation of atoms which form the upper surface of the first semiconductor layer A.

The twenty-first aspect of the present invention is that the first semiconductor layer A is made of a binary or ternary undoped Al$_x$Ga$_{1-x}$N (0≦x<1) and that the second semiconductor layer B is made of a ternary undoped Al$_y$Ga$_{1-y}$N (x<y≦1) in the twentieth aspect of the present invention.

The twenty-second aspect of the present invention is that the aluminum composition ratio x is approximately 0 and that aluminum composition ratio y is in a range from 0.15 to 0.30 in the twenty-first aspect of the present invention.

The twenty-third aspect of the present invention is that thickness of the second semiconductor layer B is 1 nm or more in any of the twentieth to twenty-second aspect of the present invention. More preferable thickness of the second semiconductor layer B may be 5 nm or more.

Through employment of the aforementioned aspects of the present invention, the aforementioned drawbacks can be overcome effectively and rationally.

The twenty-fourth aspect of the present invention is a process for forming a high-resistivity semiconductor layer A (: a semiconductor layer having high resistivity) on a crystal growth plane of a semiconductor made of an Al$_x$Ga$_{1-x}$N (0≦x≦1) through crystal growth, wherein the high-resistivity semiconductor layer A is made of an undoped Al$_x$Ga$_{1-x}$N (0≦x≦1), and crystal growth temperature of the high-resistivity semiconductor layer A at least at the early stage of the crystal growth process is arranged to be from 1120° C. to 1160° C.

Here, the early stage of the crystal growth process is about the first minute of starting the crystal growth of the high-resistivity semiconductor layer A.

The twenty-fifth aspect of the present invention is that crystal growth rate of the high-resistivity semiconductor layer A in the twenty-third aspect of the present invention is 65 nm/min or more at least at the early stage of the crystal growth process.

The twenty-sixth aspect of the present invention is that the high-resistivity semiconductor layer A in the twenty-fourth or twenty-fifth aspect of the present invention is made of an undoped GaN crystal.

The twenty-seventh aspect of the present invention is that crystal growth rate of the high-resistivity semiconductor layer A in any of the twenty-fourth to twenty-sixth aspects of the present invention is 100 nm/min or less at least at the early stage of the crystal growth process.

The twenty-eighth aspect of the present invention is that crystal growth rate of the high-resistivity semiconductor layer A in any of the twenty-fourth to twenty-seventh aspects of the present invention is in a range from 70 nm/min to 90 nm/min at least at the early stage of the crystal growth process.

The twenty-ninth aspect of the present invention is that crystal growth temperature of the high-resistivity semiconductor layer A in any of the twenty-fourth to twenty-eighth aspects of the present invention is in a range from 1130° C. to 1150° C. at least at the early stage of the crystal growth process. More preferably, the crystal growth temperature may be in a range from 1130° C. to 1140° C.

The thirtieth aspect of the present invention is that V/III ratio of crystal material gas supplied in a reaction chamber at least at the early stage of the crystal growth process of the high-resistivity semiconductor layer A in any of the twenty-fourth to twenty-ninth aspects of the present invention is in a range from 1400 to 1550.

Here, V/III ratio of crystal material gas represents a ratio of number of moles of Group V element crystal material gas comprised in the semiconductor layer to be crystal grown per unit volume to number-of moles of Group III element crystal material gas comprised in the semiconductor layer to be crystal grown per unit volume.

The thirty-first aspect of the present invention is that a Group III nitride compound semiconductor made of an undoped $Al_xGa_{1-x}N$ ($0 \leq x \leq 1$) which is fabricated by a crystal growth method of any of the twenty-fourth to thirtieth aspects of the present invention has resistivity of $1 \times 10^8$ $\Omega$cm or more.

The thirty-second aspect of the present invention is a field-effect transistor comprising: a crystal growth substrate; a buffer layer and a barrier layer made of a Group III nitride compound semiconductor formed on the crystal growth substrate; and a channel formed at the interface side of the buffer layer toward the barrier layer, wherein at least a portion of the buffer layer comprises a high-resistivity semiconductor A which is made of a undoped $Al_xGa_{1-x}N$ ($0 \leq x<1$) and has resistivity of $1 \times 10^8$ $\Omega$cm or more.

The thirty-third aspect of the present invention is a semiconductor device which is formed by depositing plural semiconductor layers each of which is made of a Group III nitride compound semiconductor on a crystal growth substrate, comprising: a high-resistivity layer which prevents or restrains leakage of electric current, wherein the high-resistivity layer is made of a high-resistivity semiconductor layer A which is made of a undoped $Al_xGa_{1-x}N$ ($0 \leq x<1$) and has resistivity of $1 \times 10^8$ $\Omega$cm or more.

Through employment of the aforementioned aspects of the present invention, the aforementioned drawbacks can be overcome efficiently and rationally.

Effects of the Invention

Effects to be obtained by the present invention are as follows.

According to the first aspect of the present invention, the abrupt interface supplying layer enables to maintain excellent crystallinity of the barrier layer, and semiconductor crystal composition around the interface between the barrier layer and the buffer layer varies rapidly.

Further, the electrode connection plane supplying layer enables to maintain excellent flatness and smoothness of the surface of the barrier layer.

Maintaining rapidness of compositions around the interface between the barrier layer and the buffer layer is effective in restraining reduction of mobility of carriers which owes to carrier scattering when the carriers transmit in the channel.

Consequently, according to the first aspect of the present invention, mobility of carriers which transmit in the channel formed around the interface, each kind of electric characteristic such as sheet resistivity of the field-effect transistor, can be manufactured excellently. And also flatness and smoothness of the surface of the barrier layer can be maintained excellently, and that improves adhesiveness of the gate electrode. As a result, adhesiveness of the gate electrode is improved and it becomes possible and easy to improve controlling field effect by applying gate voltage.

According to the second aspect of the present invention, the barrier layer can obtain larger band gap energy. The buffer layer may not necessarily comprise semiconductor crystal including indium (In) to obtain larger difference between band gap energy of the barrier layer and band gap energy of the buffer layer. Consequently, according to the second aspect of the present invention, the interface between the barrier layer and the buffer layer may hardly become rough. In short, according to the second aspect of the present invention, the interface between the barrier layer and the buffer layer can be more surely flat and smooth owing to synergy of actions and effect of the first aspect of the present invention, and that enables to more surely maintain excellent mobility of carriers.

Moreover, it is useful to form the barrier layer to be an undoped layer in order to have a preferable break down field strength of semiconductor device.

When the semiconductor crystal including indium (In) is formed through crystal growth, the interface between the semiconductor crystal and the other semiconductor layer deposited thereon tends to become rough. That can be easily understood in the following references.

(1) Japanese Laid-open patent application H11-068159
(2) Japanese Laid-open patent application H9-139543
(3) Japanese Laid-open patent application H8-88432

According to the third aspect of the present invention, it becomes possible or easier to optimize potential curve around the channel. Especially, the lower limit of aluminum composition ratio is necessary to surely form the channel, and the upper limit of aluminum composition ratio is necessary to obtain excellent ohmic electrode.

More preferably, this aspect may be applied with the seventh aspect of the present invention.

According to the fourth aspect of the present invention, difference between band gap energy of the barrier layer and band gap energy of the buffer layer can be kept larger. As a result, it becomes possible and easier to optimize potential curve around the channel. Especially, the semiconductor layer to which the ohmic electrode is connected directly can easily maintain excellent ohmic characteristic by optimizing electron affinity.

More preferably, this aspect may be applied with the third or seventh aspect of the present invention.

According to the fifth aspect of the present invention, the barrier layer of the field-effect transistor of the present invention can have two-layer structure. That is, the first layer of the barrier layer forms the abrupt interface supplying layer and the second layer of the barrier layer forms the electrode connection plane supplying layer. That is, the barrier layer comprising the abrupt interface supplying layer and the electrode connection plane supplying layer, each having different advantage, can be obtained by depositing minimum layers.

In short, employing that structure is the easiest way to provide the field-effect transistor of the present invention. Consequently, according to the fifth aspect of the present invention, the field-effect transistor of the present invention which is remarkably advantageous to miniaturize and have high performance can be produced effectively.

According to the sixth aspect of the present invention, total thickness of barrier layer is optimized, and ohmic characteristic of the barrier layer can also be optimized. But when the electrode connection plane supplying layer (the second layer of the barrier layer) is too thin, the surface of the barrier layer hardly becomes flat and smooth. Because unevenness of thickness of each deposited layer tends to become bad influence to the device characteristic, that requires attention.

That is, the sixth aspect of the present invention provides each appropriate range of the first layer of the barrier layer and the second layer of the barrier layer which is optimized experimentally and totally.

Further, in order to provide high mobility, at least the semiconductor layer to which the channel is to be formed may be doped with no impurity to prevent scattering of carriers. Also, the semiconductor layer which requires high resistivity may not be doped with any impurity. Accordingly, especially the semiconductor layer which forms at least the uppermost layer of the buffer layer is preferably a undoped layer. Accordingly, the seventh aspect of the present invention is useful.

According to the seventh aspect of the present invention, the uppermost layer of the buffer layer is made of GaN. So when the uppermost layer of the buffer layer is made of a semiconductor which does not include indium ($Al_xGa_{1-x}N$ ($0 \leq x<1$)), band gap energy of the uppermost layer can be minimized. As mentioned above, indium (In) is not used to form the uppermost layer in order to prevent roughness of the interface between the buffer layer and the barrier layer. Accordingly, GaN is a semiconductor which provides the minimum band gap energy.

Consequently, according to the seventh aspect of the present invention, the required channel can be formed.

According to the eighth aspect of the present invention, partial pressure ratio R of the gas monotonically decreases gradually or continuously in the crystal growth process. Owing to that, it becomes possible or easier not only to manufacture the field-effect transistor according to the first aspect of the present invention but also to manufacture a field-effect transistor which has the equivalent device performance and comprise a barrier layer having single-layer structure. For example, in order to manufacture a field-effect transistor comprising a barrier layer having single-layer structure, the above-mentioned partial pressure R of the gas may be decreased monotonically, uniformly and continuously.

The reason why the eighth aspect of the present invention works well as described above is that higher partial pressure ratio R of the gas is, the more excellently the above-mentioned abrupt interface supplying layer tends to be formed. Here, the interface varying rapidly functions advantageously for mobility of electrons transmitting in the channel. And that the surface of the interface is flat or smooth functions advantageously because it becomes possible or easier to miniaturize the electrode compared with the conventional electrode.

According to the ninth aspect of the present invention, partial pressure ratio R of the gas decreases gradually in times and monotonically, and that enables to manufacture an excellent field-effect transistor according to the first aspect of the present invention.

According to the tenth aspect of the present invention, it becomes possible or easier to manufacture the field-effect transistor according to the fifth aspect of the present invention. The higher partial pressure ratio R of the gas is, the more excellent the abrupt interface supplying layer tends to be formed. The lower partial pressure ratio R of the gas is, the more excellent the electrode connection plane supplying layer tends to be formed. Consequently, according to the tenth aspect of the present invention, the field-effect transistor having remarkably excellent device characteristic can be obtained.

According to the eleventh aspect of the present invention, crystal growth condition of the second semiconductor layer B at least at the early stage of in the second crystal growth process is arranged to be crystal growth condition which restrains sublimation of atoms forming the upper surface of the first semiconductor layer A. As a result, roughness of the interface of the first semiconductor layer A which owes to sublimation of atoms forming the upper surface of the first semiconductor layer A can be prevented excellently. Accordingly, the upper surface of the first semiconductor layer A (that is, the bottom surface of the second semiconductor layer B becomes approximately flat at least microscopically, mobility of carriers transmitting in the channel layer is improved, and on-state electric current increases. As a result, device characteristic of the field-effect transistor can be improved.

According to the twelfth aspect of the present invention, the crystal growth temperature $T_B$ of the second semiconductor layer B is arranged to be lower than the crystal growth temperature $T_A$ of the first semiconductor layer A, and that enables to restrain sublimation of atoms forming the upper surface of the first semiconductor layer A excellently.

According to the thirteenth aspect of the present invention, the crystal growth pressure $P_B$ of the second semiconductor layer B approximately corresponds to the crystal growth pressure $P_A$ of the first semiconductor layer A, and that enables to restrain sublimation of atoms forming the upper surface of the first semiconductor layer A very easily and effectively.

According to the fourteenth aspect of the present invention, the band gap energy $E_B$ the second semiconductor layer B can be necessarily and adequately larger than the band gap energy $E_A$ of the first semiconductor layer A, and the structure having the semiconductor layers A and B with stable crystal crystalinity and the interface with stable surface-state such as flatness can be easily obtained.

Consequently, according to the fourteenth aspect of the present invention, the field-effect transistor having excellent operating characteristic can be easily and certainly manufactured.

More generally, indium (In) can be included in a Group III nitride compound semiconductor which forms the semiconductor layer A. Employing such material may not be necessarily disadvantage to maintain larger band gap energy difference between the semiconductor layers A and B. As shown in the above-listed Laid-open patent applications (1) to (3), however, neither the semiconductor layer A nor the semiconductor layer B may preferably include indium (In) in order to form a flat and stable interface easily and certainly.

According to the fifteenth aspect of the present invention, necessary and adequate amount of the band gap energy difference ($E_B$-$E_A$) can be obtained more easily and certainly, and also the semiconductor layers A and B can have stable crystal quality and condition of interface such as flatness. Consequently, according to those conditions, the field-effect transistor having excellent operating characteristic can be easily and certainly manufactured.

More preferably, a method according to any one of the sixteenth to nineteenth aspects of the present invention may be employed. Each appropriate range in those aspects is obtained experimentally through trial and error of the inventors. So employing those methods, a semiconductor device, which has totally excellent conditions such as design of the band gap such as the channel, mobility of carriers which transmit in the channel, controllability toward forming/disappearing the channel, and crystal quality of each semiconductor layer, can be manufactured.

According to the twentieth aspect of the present invention, the field-effect transistor having excellent operating characteristic can be manufactured easily and certainly according to the first aspect of the present invention.

According to the twenty-first aspect of the present invention, the field-effect transistor having excellent operating characteristic can be manufactured easily and certainly according to the fourteenth aspect of the present invention. More preferably, aluminum composition ratio x of the first semiconductor layer A may be approximately 0 and aluminum composition ratio y of the second semiconductor layer B may be in a range from 0.15 to 0.30. Preferably, thickness of the second semiconductor layer B may be 1 nm or more, and more preferably, 5 nm or more.

By employing these conditions, the field-effect transistor having remarkably excellent electric characteristic can be obtained.

According to the twenty-fourth aspect of the present invention, the semiconductor layer with high resistivity is formed through crystal growth, and that enables the semiconductor layer (the high-resistivity semiconductor layer A) to have higher insulation compared with a conventional semi-conductor layer. Consequently, according to the twenty-fourth aspect of the present invention, an ideal undoped high-resistivity layer with excellent flatness and excellent crystallinity of the upper surface of the interface can be formed.

The principle why a semiconductor layer with high insulation can be formed under such crystal growth conditions is not yet clarified adequately, but it may be because the interface state conventionally formed between a nucleus forming layer and a semiconductor layer which was conventionally deposited thereon through crystal growth can hardly be formed under those crystal growth conditions, which results in vanishing the conventional conductive layer which was formed around the interface. Only the early stage of the crystal growth process of the high-resistivity semiconductor layer A is deeply involved with the process for forming the interface state, and its period may be the first few minutes in the crystal growth process.

More preferable crystal growth rate of the high-resistivity semiconductor layer A may be 65 nm/min or more (the twenty-fifth aspect of the present invention) That is, by crystal growing the high-resistivity layer A at such a comparatively higher growth rate in at least at the earlier stage of the crystal growth process of the high-resistivity layer A, actions and effects described above can be obtained more surely.

According to the twenty-sixth aspect of the present invention, the high-resistivity semiconductor layer A can comprise a semiconductor layer made of a undoped GaN. The undoped GaN semiconductor layer is very useful as a base substrate or a base layer of any semiconductor device. For example, as shown in an embodiment of the present invention described below, the undoped GaN semiconductor layer may be useful as a buffer layer in the field-effect transistor. Consequently, according to the twenty-sixth aspect of the present invention, a high-resistivity semiconductor layer made of GaN which is remarkably useful in industrial field can be manufactured.

The crystal growth conditions according to the twenty-seventh to thirteenth aspects of the present invention may be useful for an arbitrary aluminum composition x of the high-resistivity semiconductor layer A, and especially they are arranged to be optimum to a GaN crystal (x=0).

For example, the crystal growth rate of the high-resistivity semiconductor layer A is preferably 100 nm/min or less (the twenty-seventh aspect of the present invention). By employing that, crystallinity of the high-resistivity semiconductor layer A can be improved while maintaining excellent insulation of the high-resistivity semiconductor layer A. Further, the upper side or the surface of the interface of the high-resistivity semiconductor layer A can be maintained excellently flat and smooth.

Consequently, when the buffer layer of the field-effect transistor is formed by using such high-resistivity semiconductor layer A, carriers which transmit in the channel hardly scatter. That enables to manufacture a device having high carrier mobility.

More preferable crystal growth rate of the high-resistivity semiconductor layer A may be in a range from 70 nm/min to 90/min (the twenty-eighth aspect of the present invention).

More preferable crystal growth temperature of the high-resistivity semiconductor layer A may be in a range from 1130° C. to 1150° C. (the twenty-ninth aspect of the present invention).

In order to achieve crystal growth conditions of the present invention actually and more easily, V/III ratio of the crystal material gas may be in a range from 1400 to 1550 (the thirtieth aspect of the present invention).

According to those crystal growth conditions, an ideal undoped high-resistivity layer having both excellent flatness and excellent crystallinity of the upper side of the interface can be formed more certainly. That is, those crystal growth conditions become extremely important conditions which provide solutions for two different problems: that is, maintaining flatness of the interface or the surface of the semiconductor layer; and maintaining break down field strength of the semiconductor device.

By using the undoped high-resistivity layer which satisfies those conditions, a buffer layer having excellent quality can be formed in the field-effect transistor, which results in improving both operating characteristic and break down field strength of the device.

When the crystal growth temperature of the nucleus forming layer, or a lattice constant difference relaxing layer, is less than 800° C., nuclear density and shape of each nucleus of the semiconductor (the nucleus forming layer) which provides a crystal growth plane for the high-resistivity semiconductor layer A are optimized, and desirable ELO growth or facet growth of the high-resistivity semiconductor layer A around the interface between the semiconductor and the high-resistivity semiconductor layer A can be improved. As a result, both crystallinity and insulation of the high-resistivity semiconductor layer A can be maintained excellently. That is useful for the device comprising a sapphire substrate, and also it is useful for the device comprising other substrate.

Preferably, growth temperature of the semiconductor (the nucleus forming layer) may be 600° C. or less, further preferably, 400° C. or less. The reason why desirable result can be obtained at such range of growth temperature may be because nuclear density and shape of each nucleus of the nucleus forming layer are optimized under these conditions.

The following reference 1 refers to actions of such facet growth or ELO growth.

(Reference 1): Amano and Akasaki, "Group III nitride compound on sapphire substrate" Applied physics, Vol. 68, No. 7 (1999), p. 700-772.

The Group III nitride compound semiconductor layer (: the high-resistivity semiconductor layer A) manufactured by the above-described method, or any one of the twenty-fourth to thirtieth aspects of the present invention, has remarkably high resistivity of $1\times10^8$ Ωcm or more, so these semiconductors are quite useful in industrial field (the thirty-first aspect of the present invention).

According to the thirty-second aspect of the present invention, the ideal undoped buffer layer having both excellent flatness and excellent crystallinity of the upper side of the interface can be formed in the field-effect transistor. As a result, break down field strength of the objective field-effect transistor having high performance and high mobility can be maintained larger than that of the conventional device.

According to the thirty-third aspect of the present invention, the ideal undoped buffer layer having both excellent flatness and excellent crystallinity of the upper side of the facet can be formed. As a result, not only at least crystal quality of the high-resistivity layer can be maintained in the objective semiconductor device but also break down field strength of the objective semiconductor device can be maintained larger than that of the conventional device.

BRIEF DESCRIPTION OF THE DRAWINGS

FIG. 6 is micrographs of each surface when the layer 2042 has thickness of d2.

FIG. 11 is a table showing crystal growth conditions of the semiconductor layers A and B in the field-effect transistor 100.

DETAILED DESCRIPTION OF EXEMPLARY EMBODIMENTS

1. Explanation of the First to Tenth Aspects of the Present Invention

Rare gas (He, Ne, Ar, Kr, Xe, Rn), nitrogen ($N_2$) gas, or mixture of these gases can be employed as an inert gas for crystal growing the barrier layer. The mixture of these gases employed as an inert gas may have arbitral mixing ratio. When hydrogen ($H_2$) gas, nitrogen ($N_2$) gas, or a rare gas is employed as a main carrier gas (i.e., main component of the carrier gas), the present invention may be obtained even when a little or some amount of other gas is mixed in the carrier gas as long as any undesirable atom or element does not remain or mix in the semiconductor crystal to be crystal grown.

As a material for the crystal growth substrate comprised in the field-effect transistor of the present invention, silicon carbide (SiC) maybe the most preferable considering thermal stability and thermal radiation. Further considering manufacturing cost, sapphire or silicon (Si) may also be used. Although a GaN substrate is not so preferable considering thermal stability and thermal radiation, employing the GaN substrate may not especially prevent from carrying out the present invention.

The ohmic electrode and the Schottky electrode may be formed through well-known arbitral process. For example, as mentioned above, the ohmic electrode may be formed on the uppermost layer of the barrier layer through a thin insulation film.

The present invention will be described hereinbelow with reference to specific embodiments.

However, the present invention cannot be limited to each embodiment described below.

Embodiment 1

Figure 1:
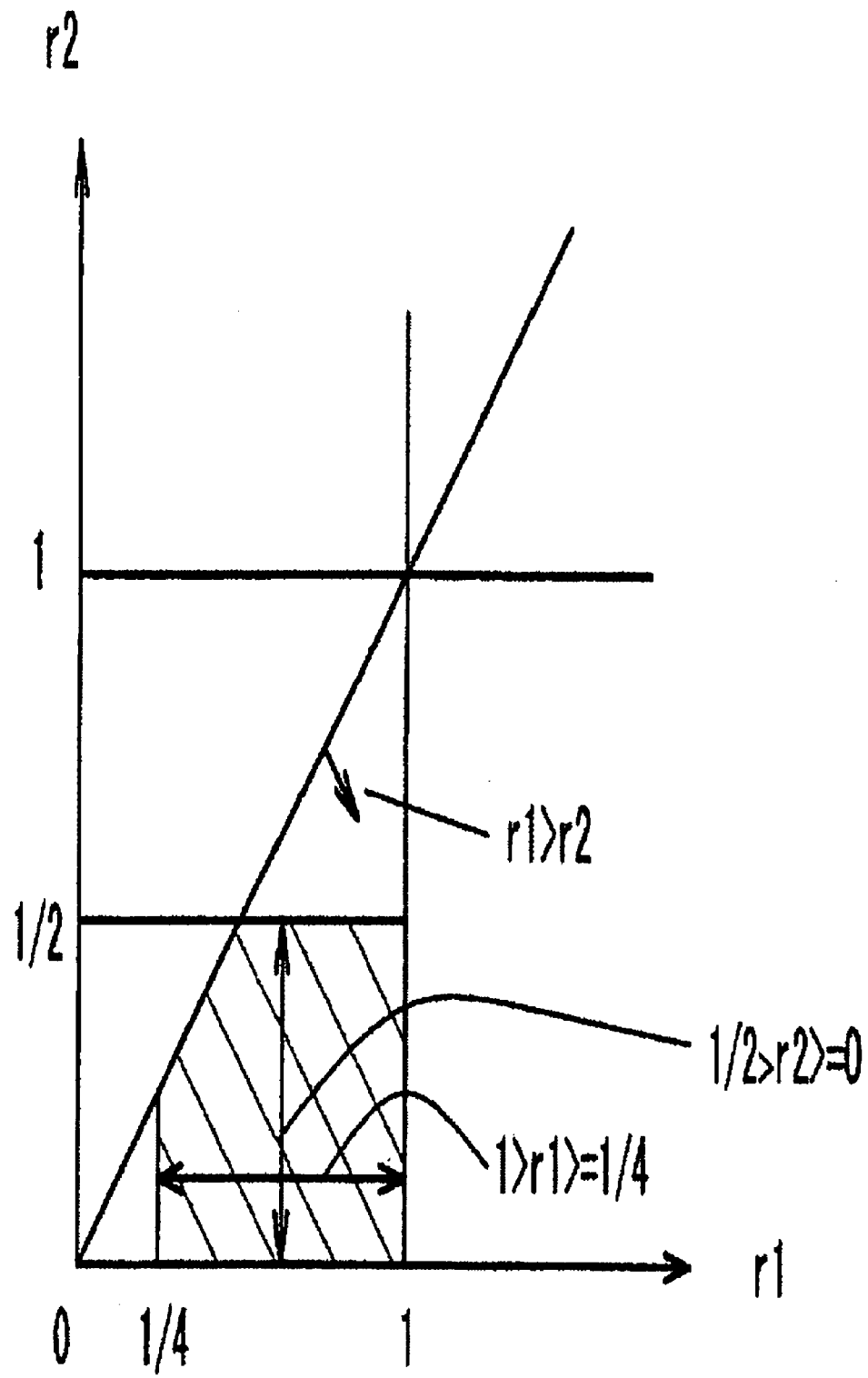
FIG. 1 is a sectional view of a field-effect transistor according to the first embodiment of the present invention.

FIG. 1 is a sectional view of a field-effect transistor 100 in the first embodiment. The field-effect transistor 100 is a semiconductor device which is formed by depositing Group III nitride compound semiconductor layers in sequence through crystal growth, and a crystal growth substrate 101 is made of sapphire having thickness of about 300 μm. On the crystal growth substrate 101, about 40 nm in thickness of AlN layer 102 made of AlN is formed. The AlN layer 102 relaxes mismatch of lattice constants between the crystal growth substrate 101 and a semiconductor layer 103 formed on the AlN layer 102.

On the AlN layer 102, about 2 μm thickness of undoped GaN semiconductor layer 103 is formed. The semiconductor layer 103 and the AlN layer 102 are generically called a buffer layer hereinafter. The buffer layer (including the layer 102 and the layer 103) is a semiconductor layer referred to as a buffer layer in claims.

Further, on the semiconductor layer 103, about 40 nm in thickness of undoped $Al_{0.2}Ga_{0.8}N$ semiconductor layer 104 is formed. Thickness (about 40 nm) of the semiconductor layer 104 is determined so that tunneling effect of carriers (electrons) from ohmic electrode (105 and 107) into a channel formed on the interface between the barrier layer and the buffer layer, or between a layer 1041 and the layer 103 become surely and preferable.

The semiconductor layer 104 comprises two layers, or about 30 nm in thickness of abrupt interface supplying layer 1041 and about 10 nm in thickness of electrode connection plane supplying layer 1042, in total. Each of these two layers is made of a undoped $Al_{0.2}Ga_{0.8}N$ semiconductor. The abrupt interface supplying layer 1041 is grown through crystal growth by using $H_2$ as carrier gas and the electrode connection plane supplying layer 1042 is grown through crystal growth by using $N_2$ as carrier gas.

Each of 105, 106, and 107 represents a source electrode (ohmic electrode), a gate electrode (Schottky electrode) and a drain electrode (ohmic electrode). Each ohmic electrode (the source electrode 105 and the drain electrode 107) is formed by depositing about 100 Å in thickness of thin metal layer made of titanium (Ti) through vapor deposition and further depositing about 3000 Å in thickness of metal layer made of aluminum (Al) through vapor deposition. These ohmic electrodes excellently adhere with each other and are alloyed through thermal treatment of flash anneal for less than 1 second under temperature from 700° C. to 900° C. The gate electrode 106 is a Schottky electrode which is formed by depositing about 100 Å in thickness of metal layer made of nickel (Ni) through vapor deposition and further depositing about 3000 Å in thickness of metal layer made of gold (Au) through vapor deposition.

A method for manufacturing the field-effect transistor 100 is explained hereinafter, referring to the main characteristic of the present invention (the semiconductor layers 1041 and 1042).

Each semiconductor layer (the semiconductor layers 102, 103, and 104) in the field-effect transistor 100 is formed through vapor phase crystal growth called metal-organic vapor phase epitaxy (hereinafter abbreviated as MOVPE). The following gasses were employed: a carrier gas ($H_2$ or $N_2$), ammonia gas ($NH_3$), trimethylgallium ($Ga(CH_3)_3$), and trimethylaluminum ($Al(CH_3)_3$).

In the present invention, metal-organic vapor phase growth (MOVPE) is employed as a method for crystal growing the semiconductor layer. As other growth methods, molecular-beam epitaxy (MBE) and halide vapor phase growth (HVPE) are useful.

Figure 2:
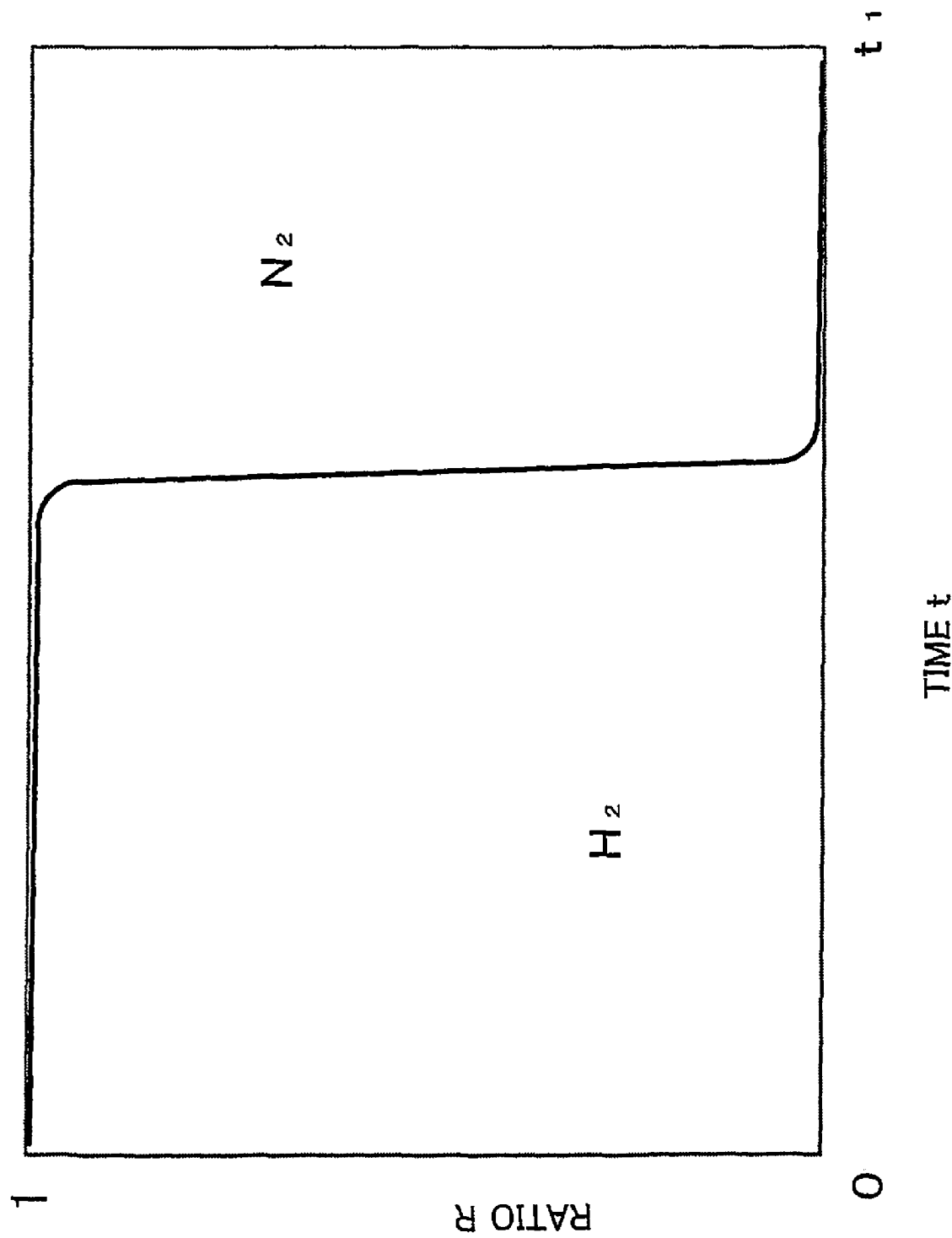
FIG. 2 is a graph of supplying carrier gas in the first embodiment.

FIG. 2 illustrates carrier gas supplying amount when the barrier layer 104 (i.e., the abrupt interface supplying layer 1041 and the electrode connection plane supplying layer 1042) is formed in the first embodiment. The axis of ordinates in the graph in FIG. 2 shows partial pressure ratio R of hydrogen gas ($H_2$) in the carrier gas, and the axis of abscissas shows crystal growth time. Time t=0 represents starting time of crystal growth of the abrupt interface supplying layer 1041, and time $t=t_1$ represents ending time of crystal growth of the electrode connection plane supplying layer 1042.

Further, the barrier layer 104 is deposited according to crystal growth conditions as follows.
(Crystal Growth Conditions of the Barrier Layer 104)
(1) The Abrupt Interface Supplying Layer 1041
  (a) carrier gas: $H_2$ (R≈1)
  (b) crystal growth temperature: 1000[° C.]
  (c) crystal growth pressure: 1013 [hPa] (total pressure in the crystal growth furnace)
(2) The Electrode-Connection Plane Supplying Layer 1042
  (a) carrier gas: $N_2$ (R≈0)
  (b) crystal growth temperature: 1000[° C.]
  (c) crystal growth pressure: 1013 [hPa] (total pressure in the crystal growth furnace)

Figure 3:
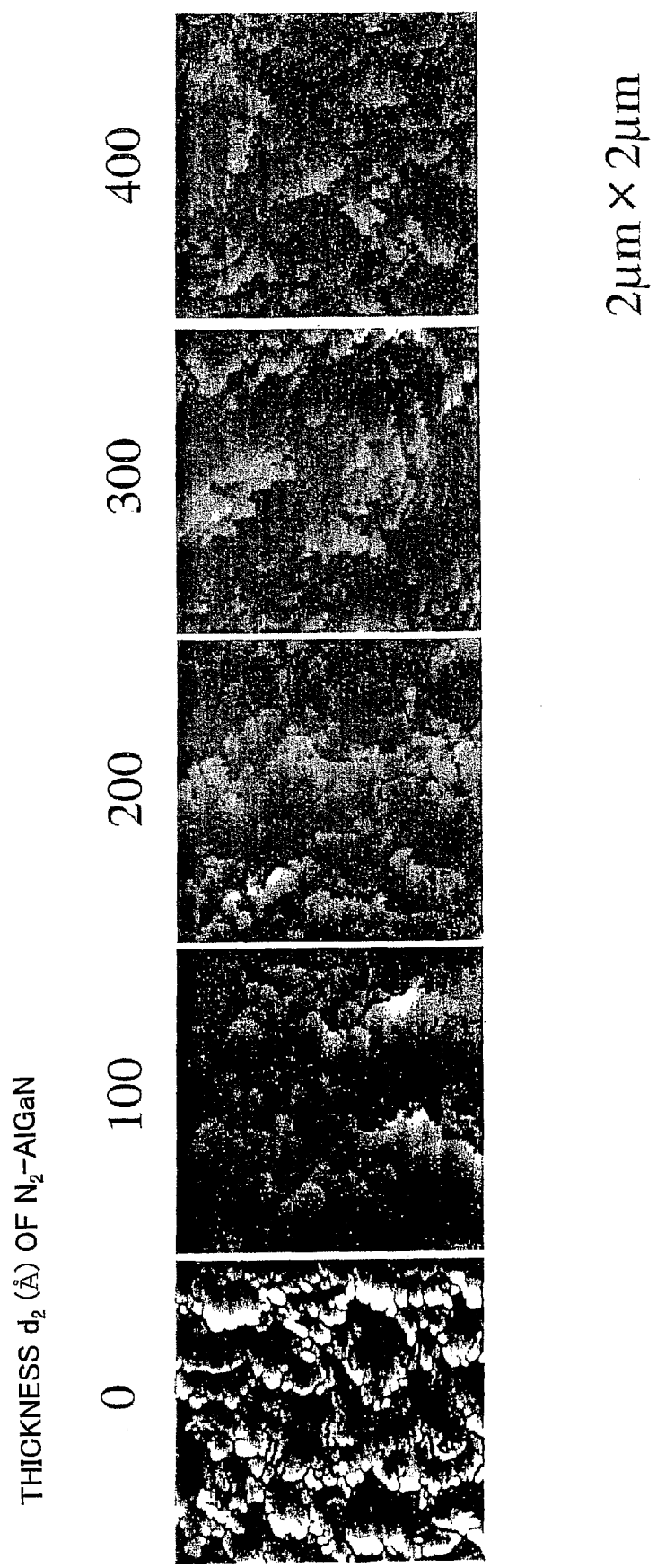
FIG. 3 is micrographs of each surface when the layer 1042 has thickness of d2.

FIG. 3 shows 5 kinds of micrographs ($d_2$=0 Å–400 Å) of the surface image (surface morphology) of the electrode connection plane supplying layer 1042 which are taken by an atomic force microscope using thickness $d_2$ of the electrode connection plane supplying layer 1042 as a parameter when total thickness of the barrier layer 104 (: $d_1+d_2$) is fixed to be 400 Å.

Figure 4A:
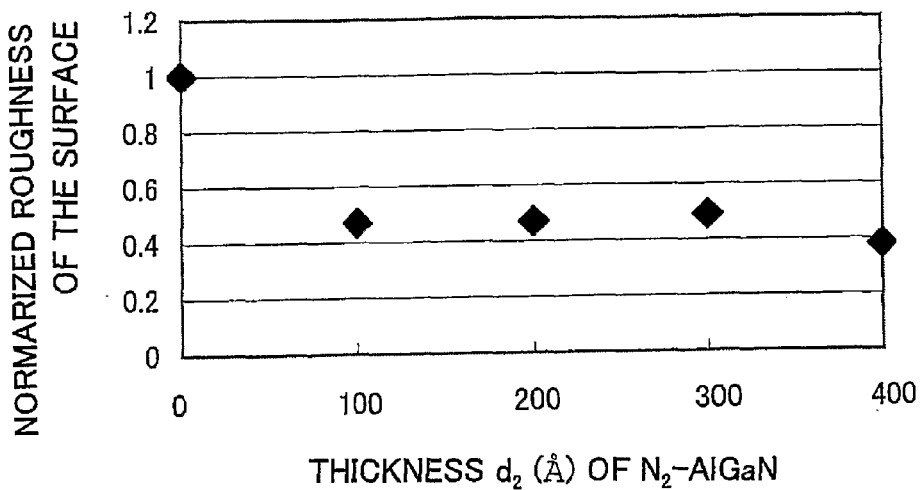
FIG. 4A is a graph showing relation between thickness d2 of the layer 1042 and roughness of its surface.

FIG. 4A shows relationship between the thickness $d_2$ of the electrode connection plane supplying layer 1042 and roughness of each surface. The axis of ordinates represents normalized root mean square of roughness wave pattern of the surface of the electrode connection plane supplying layer 1042 in a certain direction by employing the value when $d_2$=0 Å (: normalized roughness of the surface=1), or when whole of the barrier layer 104 is formed only with the abrupt interface supplying layer 1041 having thickness of about 400 Å, as a standard value.

Figure 4B:
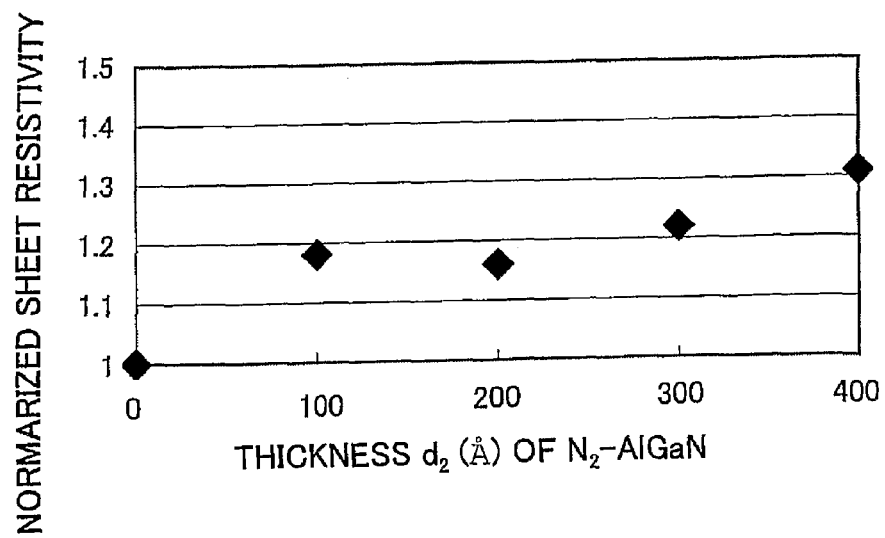
FIG. 4B is a graph showing relation between thickness d2 of the layer 1042 and sheet resistivity.

FIG. 4B is a graph showing relationship between normalized value of the sheet resistivity of the field effect transistor 100 before forming the gate electrode 106 and thickness $d_2$ by employing the value when $d_2$=0 Å (: normalized value of the sheet resistivity=1) as a standard value as same as in FIG. 4A.

According to these graphs, when the whole thickness of the barrier layer 104 is 400 Å, the thickness $d_2$ of the electrode connection plane supplying layer 1042 is preferably in a range from about 100 Å to 300 Å, more preferably from about 150 Å to 200 Å.

By forming the barrier layer 104 according to the conditions described above, the field-effect transistor 100 of the first embodiment of the present invention can maintain excellent electric characteristics such as sheet resistivity, and excellent flatness of the surface enables to miniaturize the electrode more effectively compared with the conventional art.

And output characteristics of 200 W or more can be obtained at 2 GHz of frequency band.

Embodiment 2

Figure 5:
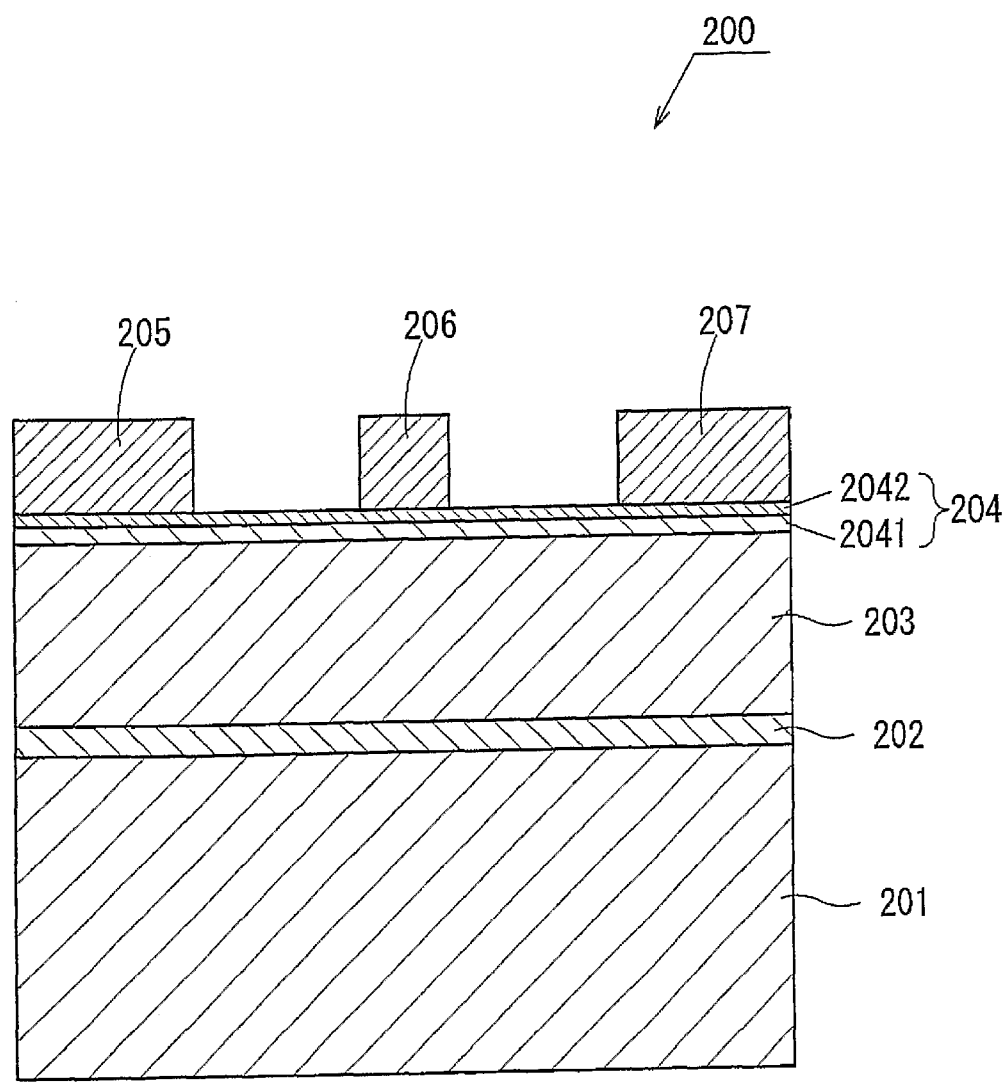
FIG. 5 is a sectional view of a field-effect transistor 200 according to the second embodiment of the present invention.

FIG. 5 is a sectional view of a field-effect transistor 200 of the second embodiment of the present invention. The field-effect transistor 200 is a semiconductor device which is formed by depositing Group III nitride compound semiconductors in sequence through crystal growth. A crystal growth substrate 201 is made of about 400 μm in thickness of silicon carbide (SiC). On the crystal growth substrate 201, about 0.2 μm in thickness of AlN layer 202 is formed. The AlN layer 202 removes or relaxes mismatch of lattice constants between the crystal growth substrate 201 and a semiconductor layer 203 formed on the AlN layer 202.

On the AlN layer 202, about 2 μm in thickness of undoped GaN semiconductor layer 203 is formed. The semiconductor layer 203 and the AlN layer 202 are generically called a buffer layer hereinafter. The buffer layer (including the layer 202 and the layer 203) is a semiconductor layer referred to as a buffer layer in claims.

Further, on the semiconductor layer 203, about 40nm in thickness of undoped $Al_{0.25}Ga_{0.75}N$ semiconductor layer 204 is formed. Thickness (about 40 nm) of the semiconductor layer 204 is determined so that tunneling effect of carriers (electrons) from ohmic electrode (205 and 207) into a channel formed on the interface between the barrier layer and the buffer layer, or between a layer 2041 and the layer 203 become surely and preferable.

The semiconductor layer 204 comprises two layers, or about 10 nm in thickness of abrupt interface supplying layer 2041 and about 30 nm in thickness of electrode connection plane supplying layer 2042, in total. Each of these two layers is made of a undoped $Al_{0.25}Ga_{0.75}N$ semiconductor. The abrupt interface supplying layer 2041 is grown through crystal growth by using $H_2$ as carrier gas and the electrode connection plane supplying layer 2042 is grown through crystal growth by using $N_2$ as carrier gas.

Each of 205, 206, and 207 represents a source electrode (ohmic electrode), a gate electrode (Schottky electrode), and a drain electrode (ohmic electrode). Each ohmic electrode (the source electrode 205 and the drain electrode 207) is formed by depositing about 100 Å in thickness of thin metal layer made of titanium (Ti) through vapor deposition and further depositing about 3000 Å in thickness of metal layer made of aluminum (Al) through vapor deposition. These ohmic electrodes excellently adhere with each other and are alloyed through thermal treatment of flash anneal for less than 1 second under temperature from 700° C. to 900° C. The gate electrode 206 is a Schottky electrode which is formed by depositing about 100 Å in thickness of metal layer made of nickel (Ni) through vapor deposition and further depositing about 3000 Å in thickness of metal layer made of gold (Au) through vapor deposition.

A method for manufacturing the field-effect transistor 200 is explained hereinafter, referring to the main characteristic of the present invention (the semiconductor layers 2041 and 2042).

Each semiconductor layer (the semiconductor layers 202, 203, and 204) in the field-effect transistor 200 is formed through vapor phase crystal growth called metal-organic vapor phase epitaxy (herein after abbreviated as MOVPE). The following gasses were employed: a carrier gas ($H_2$ or $N_2$), ammonia gas ($NH_3$), trimethylgallium (Ga $(CH_3)_3$), and trimethylaluminum ($Al(CH_3)_3$).

In the present invention, metal-organic vapor phase growth (MOVPE) is employed as a method for crystal growing the semiconductor layer. As other growth methods, molecular-beam epitaxy (MBE) and halide vapor phase growth (HVPE) are useful.

FIG. 2, which illustrates carrier gas supplying amount in the first embodiment, also illustrates carrier gas supplying amount when the barrier layer 204 (i.e., the abrupt interface supplying layer 2041 and the electrode connection plane supplying layer 2042) is formed in the second embodiment. Similar to the first embodiment, the axis of ordinates the graph in FIG. 2 shows partial pressure ratio R of hydrogen gas ($H_2$) in the carrier gas, and the axis of abscissas shows crystal growth time. Time $t=0$ represents starting time of crystal growth of the abrupt interface supplying layer 2041, and time $t=t_1$ represents ending time of crystal growth of the electrode connection plane supplying layer 2042.

Further, the barrier layer 204 is deposited according to crystal growth conditions as follows.
(Crystal Growth Conditions of the barrier Layer 204)
(1) The Abrupt Interface Supplying Layer 2041
  (a) carrier gas: $H_2$ ($R\approx1$)
  (b) crystal growth temperature: 1000[° C.]
  (c) crystal growth pressure: 1013 [hPa] (total pressure in the crystal growth furnace)
(2) The Electrode Connection Plane Supplying Layer 2042
  (a) carrier gas: $N_2$ ($R\approx0$)
  (b) crystal growth temperature: 1000[° C.]
  (c) crystal growth pressure: 1013 [hPa] (total pressure in the crystal growth furnace)

FIG. 6 shows 2 kinds of micrographs ($d_2=0$ nm and 30 nm) of the surface image (surface morphology) of the electrode connection plane supplying layer 2042 which are taken by an atomic force microscope using thickness $d_2$ [Å] of the electrode connection plane supplying layer 2042 as a parameter when total thickness of the barrier layer 204 (: $d_1+d_2$) is fixed to be 40 nm.

Figure 7A:
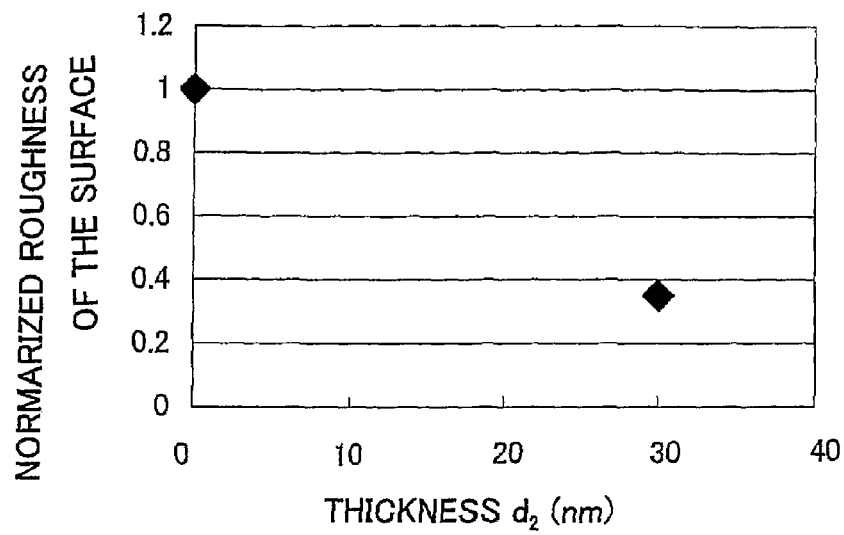
FIG. 7A is a graph showing relation between thickness d2 of the layer 2042 and roughness of its surface.

FIG. 7A shows relationship between the thickness $d_2$ of the electrode connection plane supplying layer 2042 and roughness of each surface. The axis of ordinates represents normalized root mean square of roughness wave pattern of the surface of the electrode connection plane supplying layer 2042 in a certain direction by employing the value when $d_2=0$ Å (: normalized roughness of the surface=1), or when whole of the barrier layer 204 is formed only with the abrupt interface supplying layer 2041 having thickness of about 40 nm, as a standard value.

Figure 7B:
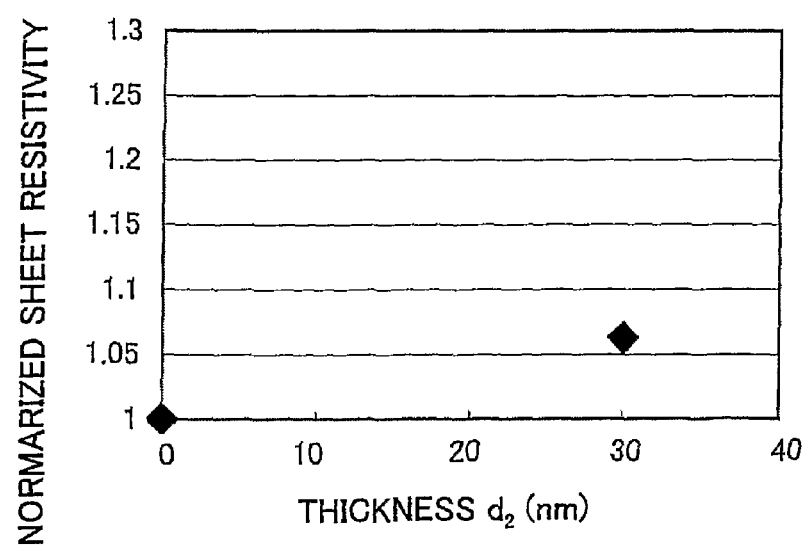
FIG. 7B is a graph showing relation between thickness d2 of the layer 2042 and sheet resistivity.

FIG. 7B is a graph showing relationship between normalized value of the sheet resistivity of the field effect transistor 200 before forming the gate electrode 206 and thickness $d_2$ by employing the value when $d_2=0$ Å (: normalized value of sheet resistivity=1) as a standard value as same as in FIG. 7A.

As shown in these graphs, the barrier layer may have two-layer structure comprising the abrupt interface supplying layer 2041 and the electrode connection plane supplying layer 2042 in order to provide the objected electric characteristic and miniaturization of the electrode highly and rationalistically.

By forming the barrier layer 204 according to the conditions described above, the field-effect transistor 200 of the first embodiment of the present invention can maintain excellent electric characteristics such as sheet resistivity, and excellent flatness of the surface enables to miniaturize the electrode more effectively compared with the conventional art.

Other Modified Embodiment

While the present invention has been described with reference to the above embodiments as the most practical and optimum ones, the present invention is not limited thereto, but may be modified as appropriate without departing from the spirit of the invention.

Modified Embodiment 1

Figure 8:
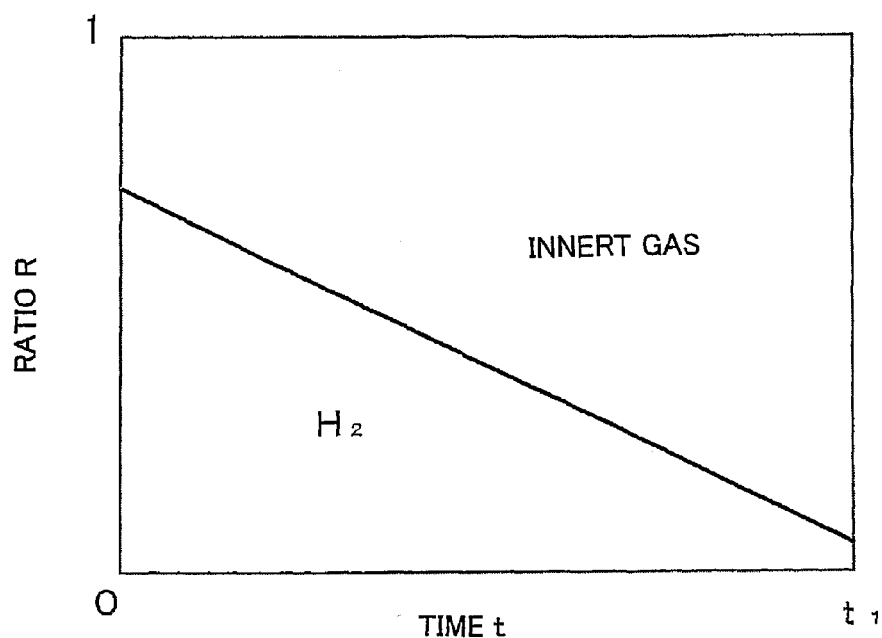
FIG. 8 is a graph of supplying carrier gas in the modified embodiment 1.

For example, in the first embodiment, partial pressure ratio R of hydrogen gas in the carrier gas is decreased from about 1 to about 0 at once as shown in FIG. 2. Alternatively, partial pressure ratio R of hydrogen gas in the carrier gas may be decreased uniformly and consecutively as shown in FIG. 8. At that time, the barrier layer 104 may not have two-layer structure in which the abrupt interface supplying layer 1041 and the electrode connection plane supplying layer 1042 can be distinguished with each other clearly, but a field-effect transistor having performance almost equivalent to that of the field-effect transistor 100 described above.

Modified Embodiment 2

Figure 9:
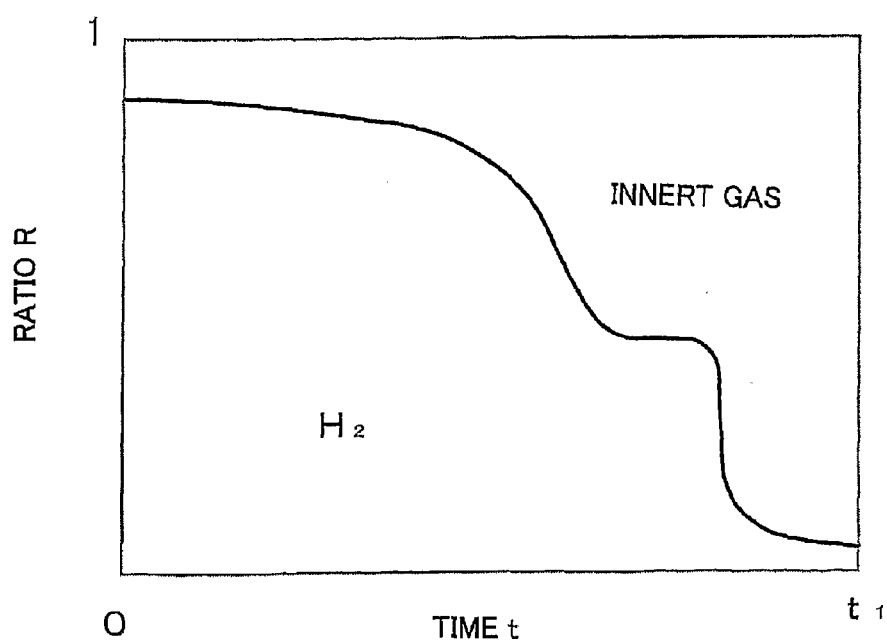
FIG. 9 is a graph of supplying carrier gas in the modified embodiment 2.

Alternatively, partial pressure ratio R of hydrogen gas in the carrier gas may be decreased gradually and momentarily. Further alternatively, decreasing process of the partial pressure ratio R can be a combination of smooth and consecutive decrease and rapid and step decrease. The embodiment as shown in FIG. 9 may includes such a combination of each decreasing process.

By employing any of these conditions, actions and effects of the present invention can be obtained according to the method of the present invention.

2. Explanation of the Eleventh to Twenty-Third Aspects

As a material which forms the crystal growth substrate comprised in the field-effect transistor of the present invention, silicon carbide (SiC) may be the most preferable considering thermal tightness and thermal radiation. Alternatively, sapphire, silicon (Si), or GaN can be used to form the substrate.

The ohmic electrode and the Schottky electrode can be formed by a well-known and arbitral process.

The present invention will be described hereinbelow with reference to specific embodiments.

However, the present invention cannot be limited to each embodiment described below.

Embodiment 3

Figure 10:
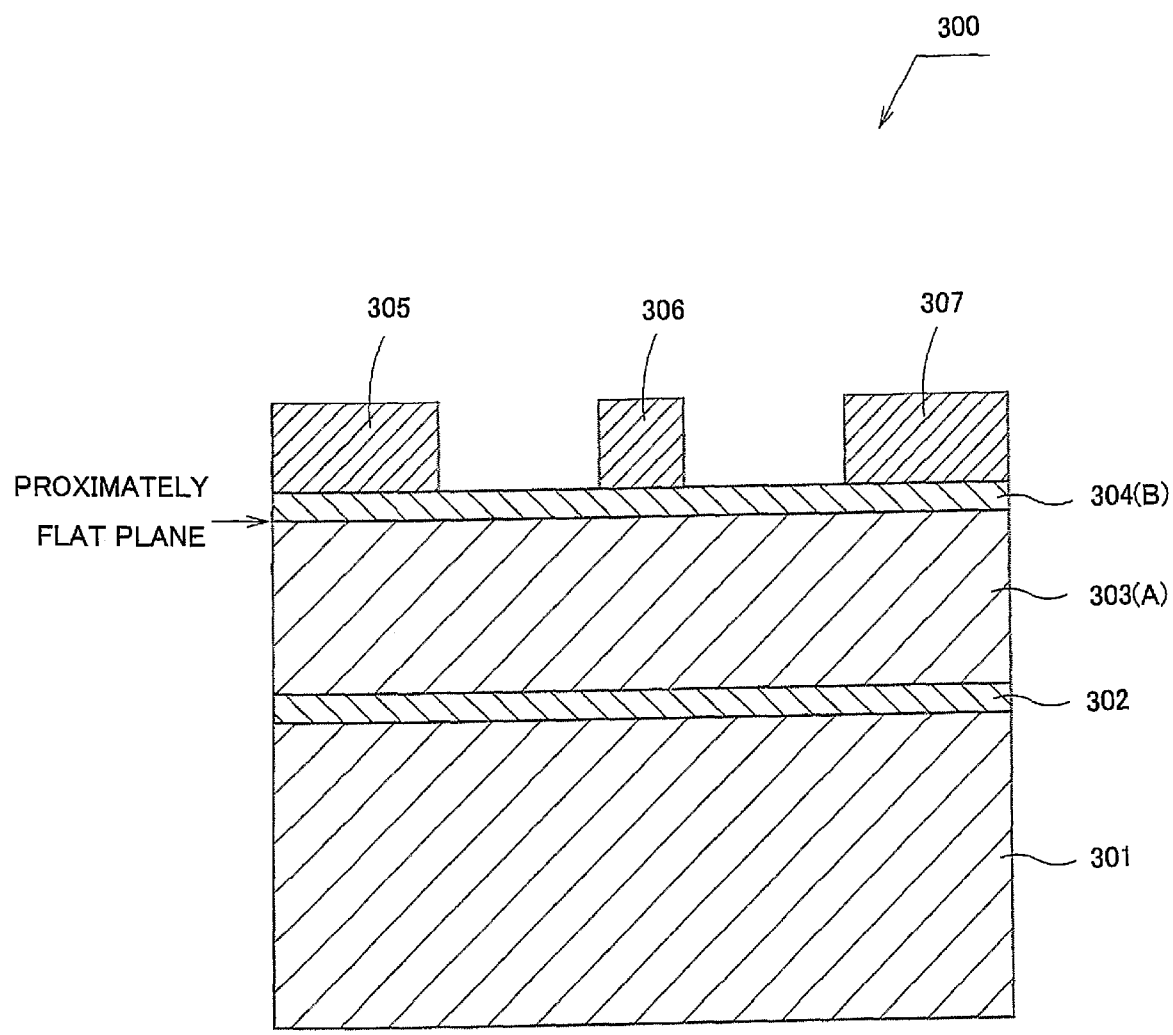
FIG. 10 is a sectional view of a field-effect transistor 100 according to the third embodiment.
Figure 12:
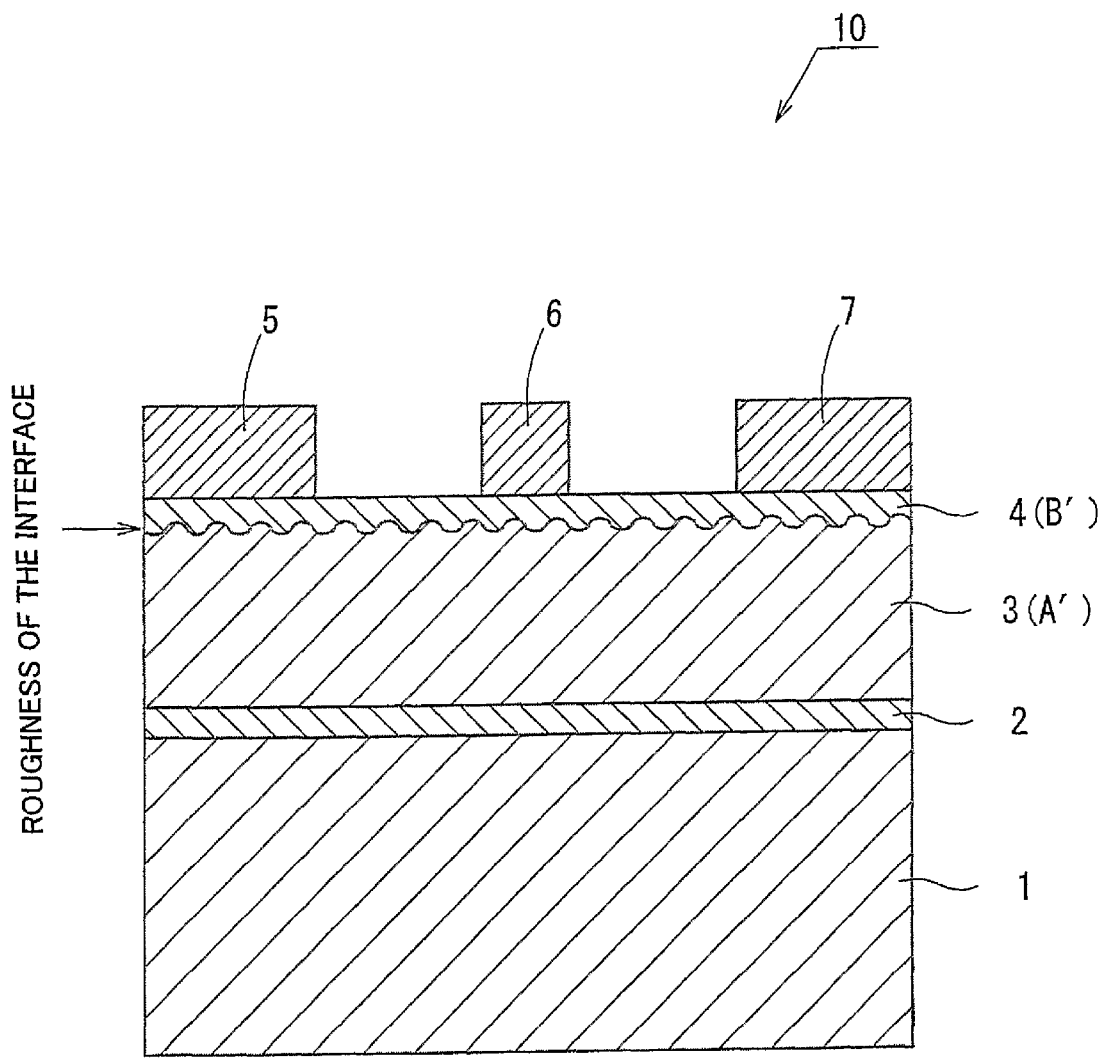
FIG. 12 is a sectional view of a conventional field-effect transistor 10.

FIG. 10 is a sectional view of a field-effect transistor 300 in the third embodiment. The field-effect transistor 300 is a semiconductor device which is formed by depositing Group III nitride compound semiconductor layers in sequence through crystal growth, and a crystal growth substrate 301 is made of silicon carbide (SiC) having thickness of about 500 μm. On the crystal growth substrate 301, about 0.3 μm in thickness of AlN layer 302 made of AlN is formed.

On the AlN layer 302, about 2 μm thickness of undoped GaN semiconductor layer 303 is formed. The semiconductor layer 303 corresponds to the first semiconductor layer A in the first embodiment of the present invention. On the semiconductor layer 303 (the first semiconductor layer A), about 35 nm in thickness of undoped $Al_{0.25}Ga_{0.75}N$ semiconductor layer 304, which corresponds to the second semiconductor layer B in the first embodiment, is formed. Thickness of the semiconductor layer 304 (the second semiconductor layer B) is determined so that tunneling effect of carriers (electrons) from ohmic electrode (305 and 307) into a channel layer formed on the interface between the semiconductor layers A and B when gate is on-state become sure and preferable.

Each of 305, 306, and 307 represents a source electrode (ohmic electrode), a gate electrode (Schottky electrode), and a drain electrode (ohmic electrode). Each ohmic electrode (the source electrode 305 and the drain electrode 307) is formed by depositing about 100 Å in thickness of thin metal layer made of titanium (Ti) through vapor deposition and further depositing about 3000 Å in thickness of metal layer made of aluminum (Al) through vapor deposition. These ohmic electrodes excellently adhere with each other and are alloyed through thermal treatment of flash anneal for less than 1 second under temperature from 700° C. to 900° C. The gate electrode 306 is a Schottky electrode which is formed by depositing about 100 Å in thickness of metal layer made of nickel (Ni) through vapor deposition and further depositing about 3000 Å in thickness of metal layer made of gold (Au) through vapor deposition.

A method for manufacturing the field-effect transistor 300 is explained hereinafter, referring to the main characteristic of the present invention (the semiconductor layers 303 and 304).

Each semiconductor layer (the semiconductor layers 302, 303, and 304) in the field-effect transistor 300 is formed through vapor phase crystal growth called metal-organic vapor phase epitaxy (hereinafter abbreviated as MOVPE). The following gasses were employed: a carrier gas ($H_2$ or $N_2$), ammonia gas ($NH_3$), trimethylgallium ($Ga(CH_3)_3$), and trimethylaluminum ($Al(CH_3)_3$).

In the present invention, metal-organic vapor phase growth (MOVPE) is employed as a method for crystal growing the semiconductor layer. As other growth methods, molecular-beam epitaxy (MBE) and halide vapor phase growth (HVPE) are useful.

FIG. 11 illustrates crystal growth conditions of the semiconductor layers A and B of the field-effect transistor 300 in the third embodiment. As shown in FIG. 11, crystal growth of the semiconductor layer 303 (or the first semiconductor layer A in the present invention), having a thickness of about 2 μm and comprised in the field-effect transistor 300, is carried out according to crystal growth conditions as follows.
(Crystal Growth Conditions of the Semiconductor Layer A)
(1) crystal growth temperature $T_A$: 1100[° C.]
(2) crystal growth pressure $P_A$: 1013 [hPa]

Next, crystal growth of the semiconductor layer 104 (or the second semiconductor layer B), having a thickness of about 35 nm and is made of a undoped $Al_{0.25}Ga_{0.75}N$ crystal, is carried out according to the crystal growth conditions as follows.
(Crystal Growth Conditions of the Semiconductor Layer B)
(1) crystal growth temperature $T_B$: 1000[° C.]
(2) crystal growth pressure $P_B$: 1013 [hPa]

The largest characteristic of the third embodiment is that each crystal growth temperature $T_A$ and $T_B$ and each crystal growth pressure $P_A$ and $P_B$ of the first and the second semiconductor layers A and B (the semiconductor layers 303 and 304), respectively, satisfies the following equation (2). The equation (1) described below is a representative crystal growth condition in a manufacturing process of a conventional transistor 10.
(Crystal Growth Condition in the Conventional Invention)

$$T_B > T_A,$$

$$P_B < P_A \quad (1)$$

(Crystal Growth Condition in the Third Embodiment)

$$1000°\ C. = T_B < T_A = 1100°\ C.,$$

$$P_B = P_A = \text{(normal pressure)} \quad (2)$$

By employing such crystal growth condition, crystal growth temperature in the crystal growth furnace decreases and crystal growth pressure is kept at almost normal pressure after the semiconductor layer 303 (the first semiconductor layer A) is deposited to be a thickness of 2 μm. As a result, sublimation of atoms which form the upper surface of the semiconductor layer 303 (the first semiconductor layer A) can be restrained effectively. Accordingly, by employing the crystal growth condition described above, roughness of the interface between the semiconductor layers 303 and 304 can be prevented effectively.

As a result, as shown in FIG. 11, on-state current I can be improved from 0.7 [A/mm] to 1.0 [A/mm], sheet resistivity ρ can be decreased from 650 [Ω/□] to 450 [Ω/□], and mobility μ of a channel can be improved to be from 1000 [$cm^2$/Vsec] to 1500 [$cm^2$/Vsec] in the field-effect transistor 300 of the present invention.

These electric characteristics have extremely high performance such that sheet concentration of the channel layer (two-dimensional electron gas) is about $1 \times 10^{13}$ [$cm^{-2}$]. In short, by employing the structure and method for manufacturing the field-effect transistor 300 in the third embodiment of the present invention, electric characteristics of the device can be remarkably improved compared with the conventional art.

OTHER MODIFIED EXAMPLE

While the present invention has been described with reference to the above embodiments as the most practical and optimum ones, the present invention is not limited thereto, but may be modified as appropriate without departing from the spirit of the invention.

Modified Example 1

For example, in the first embodiment, the interface between the semiconductor layer A (the semiconductor layer 303) and the semiconductor layer B (the semiconductor layer 304) is almost a flat plane. The interface may preferably be as flat as possible microscopically, but it may not be necessarily flat macroscopically. For example, the interface between those two semiconductor layers may be a curved surface which is a portion of an approximately spherical surface whose curvature radius is comparatively large. Further alternatively, the interface between those two semiconductor layers may be a rugged and non-planar surface which has proper incline, proper interval between each wall, and proper repetition rate. These conditions are arbitrary design conditions for forming each field-effect transistor, and roughness of the surface of the semiconductor layer A can be prevented with any of those interfaces according to the present invention. The smoothing effect enables to provide actions and effects of the present invention.

3. Explanation of the Twenty-Fourth to Thirty-Third Aspects

In the present invention, metal-organic vapor phase growth (MOVPE) is employed as a method for crystal growing the semiconductor layer. As other growth methods, molecular-beam epitaxy (MBE) and halide vapor phase growth (HVPE) are useful.

As a carrier gas which carry crystal material gas of the semiconductor layer during crystal growth, not only $H_2$ gas but also inert gas can be used. Rare gas (He, Ne, Ar, Kr, Xe, Rn), nitrogen ($N_2$) gas, or mixture of these gases can be employed as an inert gas for crystal growing the semiconductor layer. The mixture of these gases employed as an inert gas may have arbitral composition ratio. When the mixture gas is used as an inert gas (i.e., main component of the carrier gas), the present invention may be obtained even when a little or some amount of other gas, e.g., $H_2$ gas, is mixed in the carrier gas as long as any undesirable atom or element does not remain or mix in the semiconductor crystal to be crystal grown.

As a material for the crystal growth substrate comprised in the field-effect transistor of the present invention, silicon carbide (SiC) may be the most preferable considering thermal stability and thermal radiation. Alternatively, comparatively cheaper materials such as sapphire and silicon (Si) may also be used. Although a GaN substrate is not so preferable considering thermal stability and thermal radiation, employing the GaN substrate may not especially prevent from carrying out the present invention.

The ohmic electrode and the Schottky electrode may be formed through well-known arbitral process. For example, as mentioned above, the gate electrode may be formed on the uppermost layer of the barrier layer through a thin insulation film.

According to kinds and functions of the device, the barrier layer in the field-effect transistor of the present invention may comprise an undoped semiconductor layer or a semiconductor layer doped with impurities. Further alternatively, the barrier layer may comprise plural semiconductor layers each having different composition. Those conditions can be applied to the barrier layer in the field-effect transistor of the present invention. Here, in order to provide high mobility, the semiconductor layer to which the channel is to be formed may be doped with no impurity to prevent scattering of carriers. Accordingly, at least the uppermost layer of the semiconductor layers comprised in the buffer layer may preferably be formed with an undoped semiconductor layer.

The present invention will be described hereinbelow with reference to specific embodiments.

However, the present invention cannot be limited to each embodiment described below.

Fourth Embodiment

Figure 13:
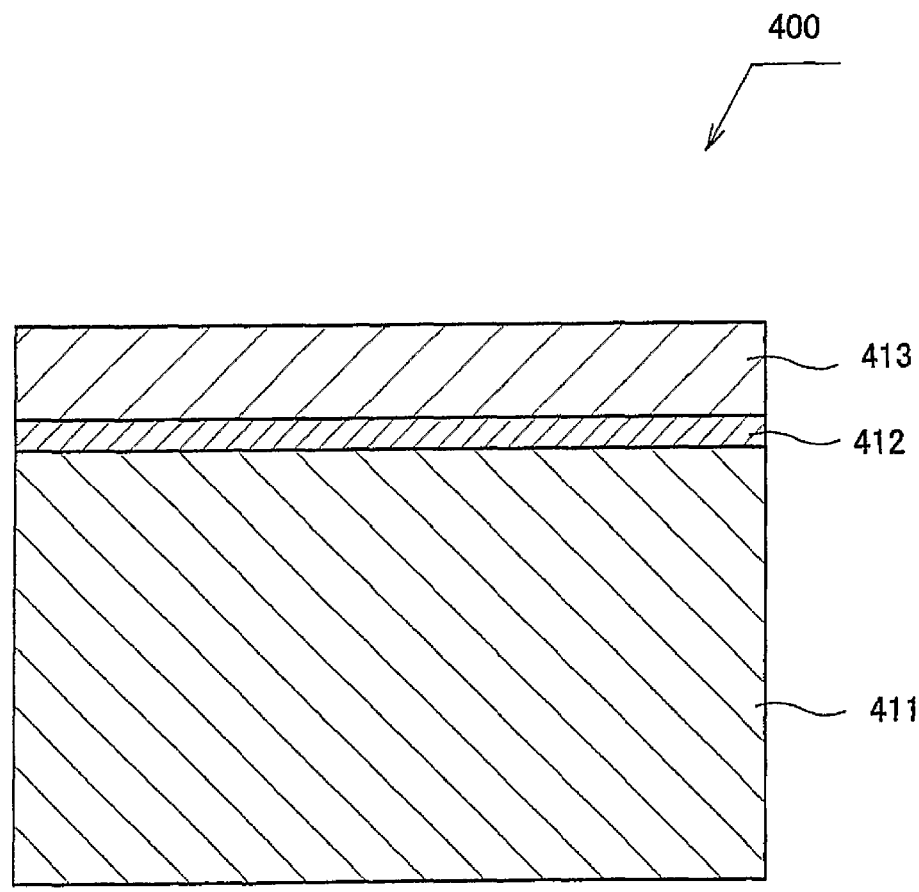
FIG. 13 is a sectional view of a sample 10 comprising a undoped high-resistivity semiconductor layer 13 according to the fourth embodiment of the present invention.

FIG. 13 is a sectional view of a sample 400 which comprises a undoped high-resistivity semiconductor layer 13 and is manufactured through MOVPE treatment in the fourth embodiment of the present invention. A substrate 411 is made of silicon carbide (4H—SiC) and about 200 nm in thickness of AlN nucleus forming layer 412 which is grown at high crystal growth temperature of 1140° C. is formed thereon. On the high growth temperature nucleus forming layer 412, a high-resistivity semiconductor layer 413 which is made of a undoped GaN and has a thickness of about 2 μm is formed under crystal growth conditions as follows.

(Crystal Growth Condition of the High-Resistivity Semiconductor Layer 413)

carrier gas: hydrogen ($H_2$) gas
total pressure in the growth furnace: 1013 [hPa]
crystal growth rate: 80 [nm/min]
V/III ratio: 1473
crystal growth temperature: (a) 1120[° C.], (b) 1130[° C.], (c) 1140[° C.], (d) 1150[° C.]

(Evaluation for Break Down Field Strength)

According to each of the crystal growth conditions described above, the undoped high-resistivity semiconductor layer 413 is deposited and 4 kinds of the sample 400 shown in FIG. 13 is manufactured in total at each crystal growth temperature (a) to (d). About 15 nm in thickness of electrode made of vanadium (V) is formed around both sides on the upper surface of the respective high-resistivity semiconductor layers 413, and leak electric currents of the respective high-resistivity semiconductor layers 413 are measured.

Figure 14:
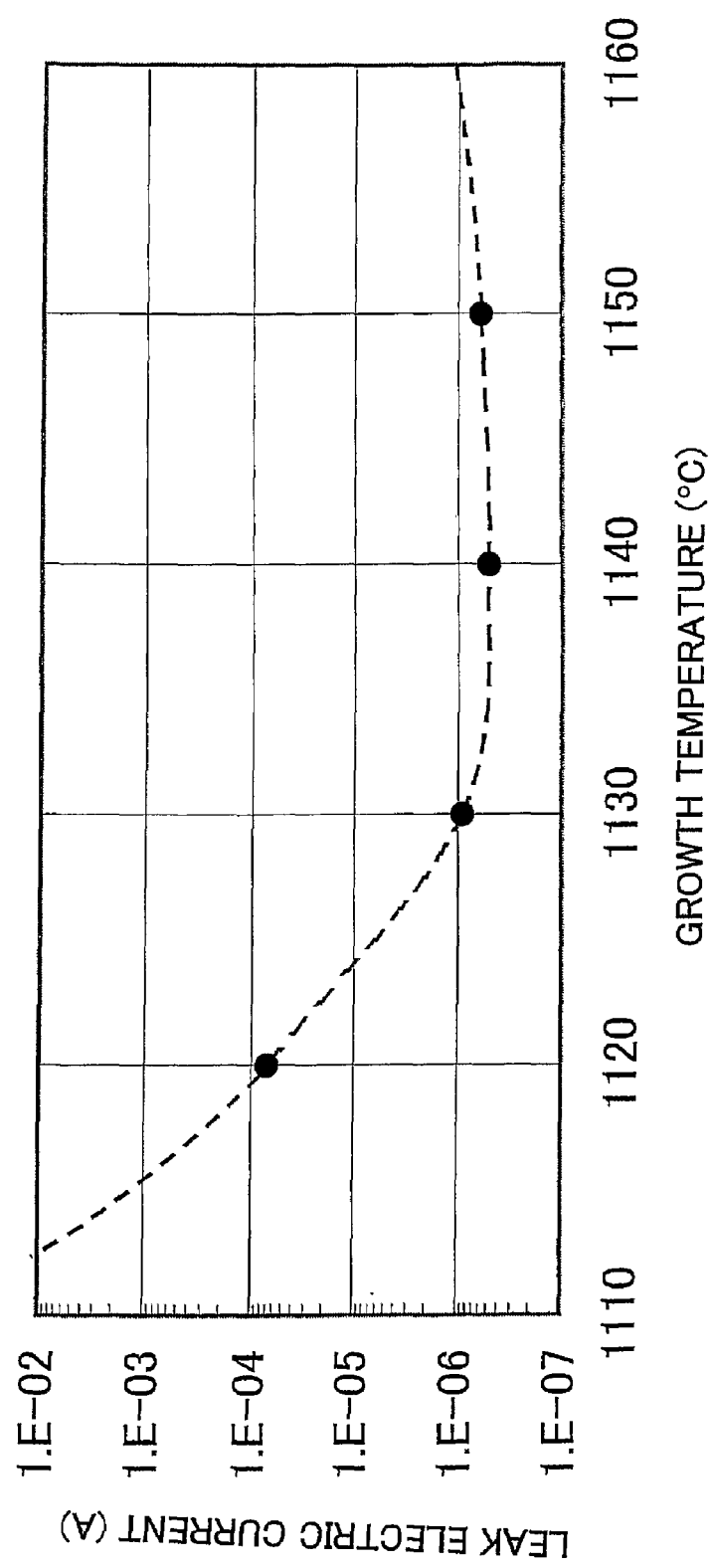
FIG. 14 is a graph showing relationship between crystal growth temperature of the high-resistivity semiconductor layer 13 and leak electric current.

FIG. 14 is a graph showing relationship between crystal growth temperature of the high-resistivity semiconductor layer 413((a) to (d)) and leak electric current at applied voltage of 200V. According to the graph, when the high-resistivity semiconductor layer is made of a undoped GaN layer, crystal growth temperature needs to be 1120° C. or more in order that leak electric current at applied voltage of 200V is $1 \times 10^{-4}$ [A] or less. In order to control leak electric current to be $1 \times 10^{-6}$ [A] or less, crystal growth temperature is preferably 1130° C. or more.

The high-resistivity semiconductor layer 413 which is made of a undoped Gan at crystal growth temperature (c) of 1140[° C.] has remarkably high resistivity of $1 \times 10^8$ Ωcm.

(Evaluation for Crystallinity)

Figure 15:
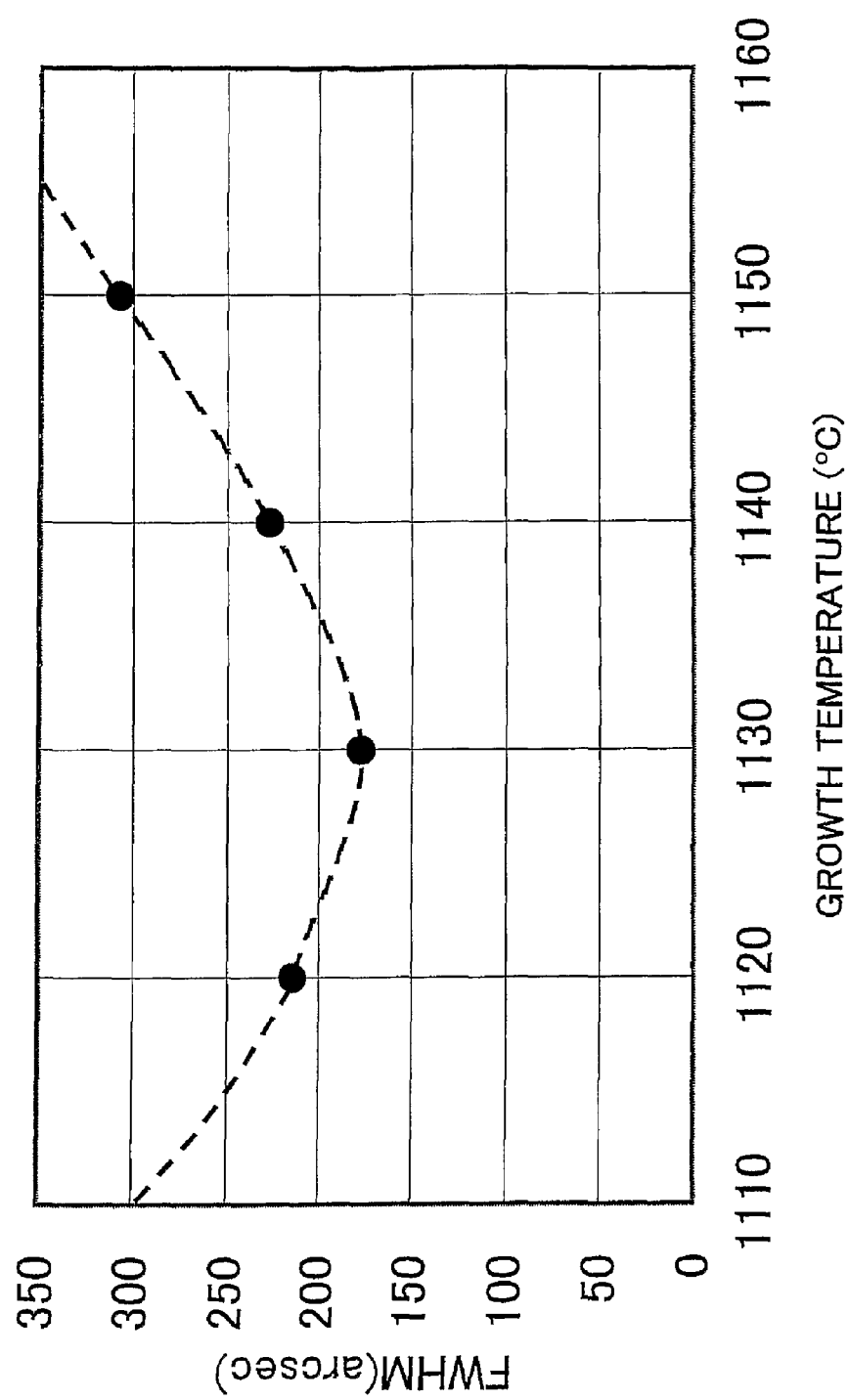
FIG. 15 is a graph showing relationship between crystal growth temperature of the high-resistivity semiconductor layer 13 and FWHM.

In the meanwhile, FWHM (: Full Width Half Maximum) of the high-resistivity semiconductor layer in each samples 400 ((a) to (d)). FIG. 15 is a graph showing the result. FIG. 15 shows relationship between crystal growth temperature of each high-resistivity semiconductor layer 413 and its FWHM. The smaller FWHM is, the better crystallinity of the layer becomes. And when FWHM is larger than 300 (arcsec), crystallinity of the high-resistivity semiconductor layer 413 is gradually deteriorated, and when FWHM becomes larger than 400 (arcsec), flatness of the surface of the high-resistivity semiconductor layer 413 is extremely deteriorated until it also deteriorates device characteristic such as mobility of carriers.

Accordingly, in order to manufacture a field-effect transistor having high performance and comprising the undoped Gan high-resistivity semiconductor layer 413, crystal growth temperature should be 1160° C. or less. Those tendency with respect to crystallinity can be recognized visually by using an optical microscope.

According to result of the experiments described above, crystal growth temperature of the high-resistivity semiconductor layer 413 may preferably be in a range from 1120° C. to 1160° C., further preferably in 1130° C. to 1150° C. so as to obtain at least a field-effect transistor having high performance.

Fifth Embodiment

Figure 16:
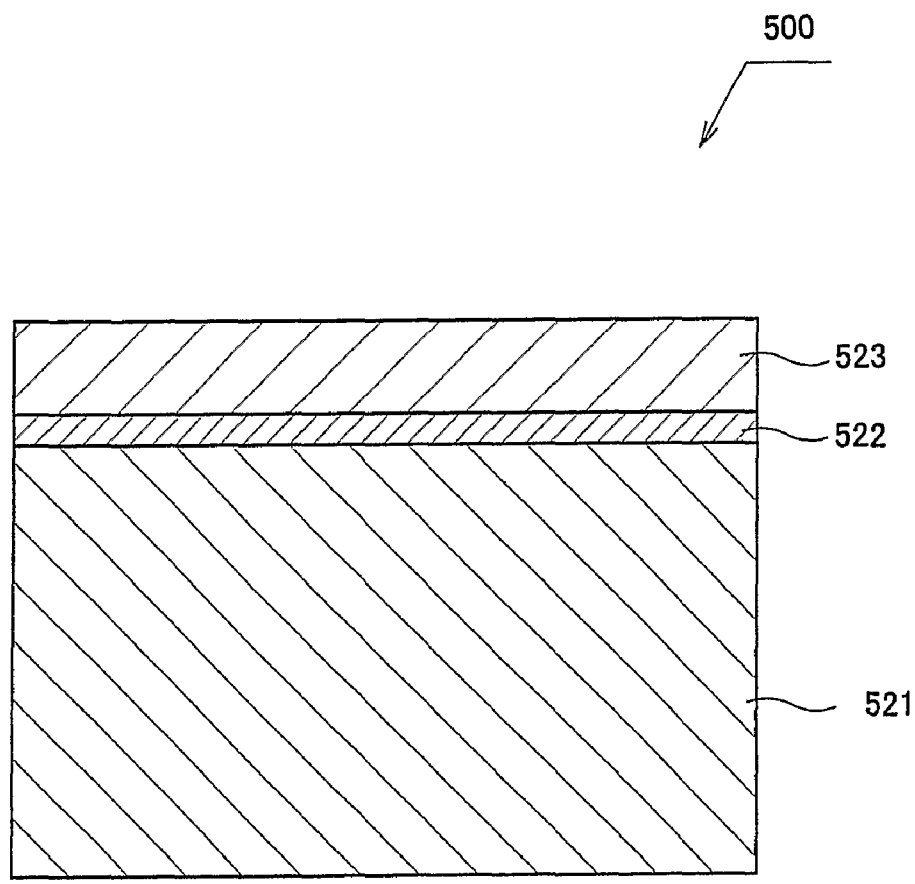
FIG. 16 is a sectional view of a sample 20 comprising a undoped high-resistivity semiconductor layer 23 according to the fifth embodiment of the present invention.

FIG. 16 is a sectional view of a sample 500 which comprises a undoped high-resistivity semiconductor layer 523 and is manufactured through MOVPE treatment in the fifth embodiment of the present invention.

A substrate 521 is made of sapphire having a 'c' plane as a main plane and about 40 nm in thickness of AlN nucleus forming layer 522 which is grown at low crystal growth temperature of 400° C. is formed thereon. On the low growth temperature nucleus forming layer 522, a high-resistivity semiconductor layer 523 which is made of a undoped GaN and has a thickness of about 2 μm is formed under crystal growth conditions as follows.

(Crystal Growth Condition of the High-Resistivity Semiconductor Layer 523)
    carrier gas: hydrogen ($H_2$) gas
    total pressure in the growth furnace: 1013 [hPa]
    crystal growth temperature: 1150[° C.]
    V/III ratio: 1473
    crystal growth rate:
        (e) 659 [Å/min], (f) 827 [Å/min],
        (g) 968 [Å/min]

(Evaluation for Break Down Field Strength)

According to each of the crystal growth conditions described above, the undoped high-resistivity semiconductor layer 523 is deposited and 3 kinds of the sample 500 shown in FIG. 16 is manufactured in total at each crystal growth temperature (e) to (g). About 15 nm in thickness of electrode made of vanadium (V) is formed on the both sides of the upper surface of the respective high-resistivity semiconductor layers 523, and leak electric currents of the respective high-resistivity semiconductor layers 523 are measured.

Figures 17A, 17B:
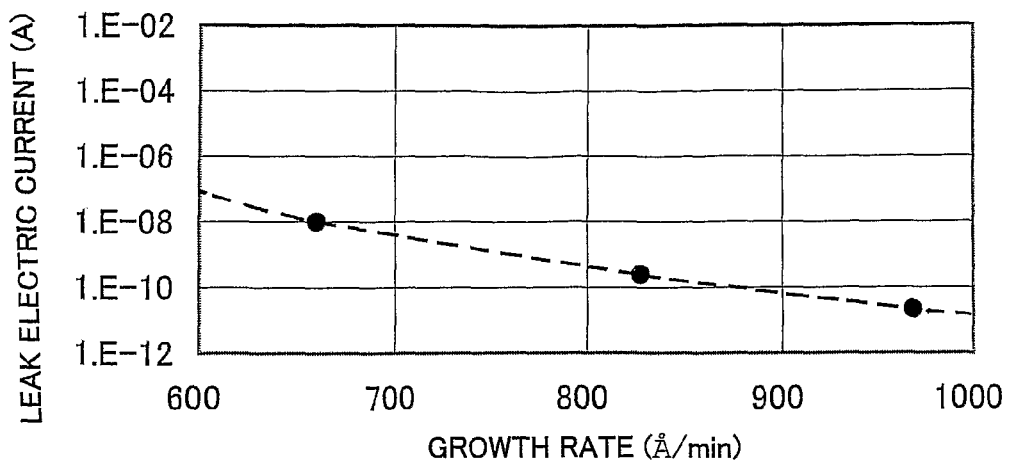
FIG. 17A is a graph showing relationship between growth rate of the high-resistivity semiconductor layer 23 and leak electric current.
FIG. 17B is a table showing relationship between growth rate of the high-resistivity semiconductor layer 23 and leak electric current.

FIGS. 17A and 17B are graphs showing relationship between crystal growth rate of the high-resistivity semiconductor layer 523 ((e) to (g)) and leak electric current at applied voltage of 40V. According to the graph, when the high-resistivity semiconductor layer is made of a undoped GaN layer, crystal growth rate needs to be 65 [nm/min] or more in order that leak electric current at applied voltage of 40V is $1 \times 10^{-8}$ [A] or less.

The high-resistivity semiconductor layer 523 which is made of a undoped Gan at crystal growth rate (g) of 968 [Å/min] has remarkably high resistivity of $1 \times 10^8$ Ωcm.

(Evaluation for Crystallinity)

In the meanwhile, crystallinity of the high-resistivity semiconductor layer 523 is gradually deteriorated when crystal growth rate is about 90 [nm/min] or more. When crystal growth rate is about 100 [nm/min] or more, flatness of the surface of the high-resistivity semiconductor layer 523 is extremely deteriorated until it also deteriorates device characteristic such as mobility of carriers. Accordingly, in order to manufacture a field-effect transistor having high performance and comprising the undoped Gan high-resistivity semiconductor layer 523, crystal growth rate should be 10 nm/min or less. Those tendencies with respect to crystallinity can be recognized visually by using an optical microscope.

According to result of the experiments described above, crystal growth rate of the high-resistivity semiconductor layer 523 may preferably be in a range from 65 nm/min to 10 nm/min, further preferably in 70 nm/min to 90 nm/min so as to obtain at least a field-effect transistor having high performance.

Sixth Embodiment

Figure 18:
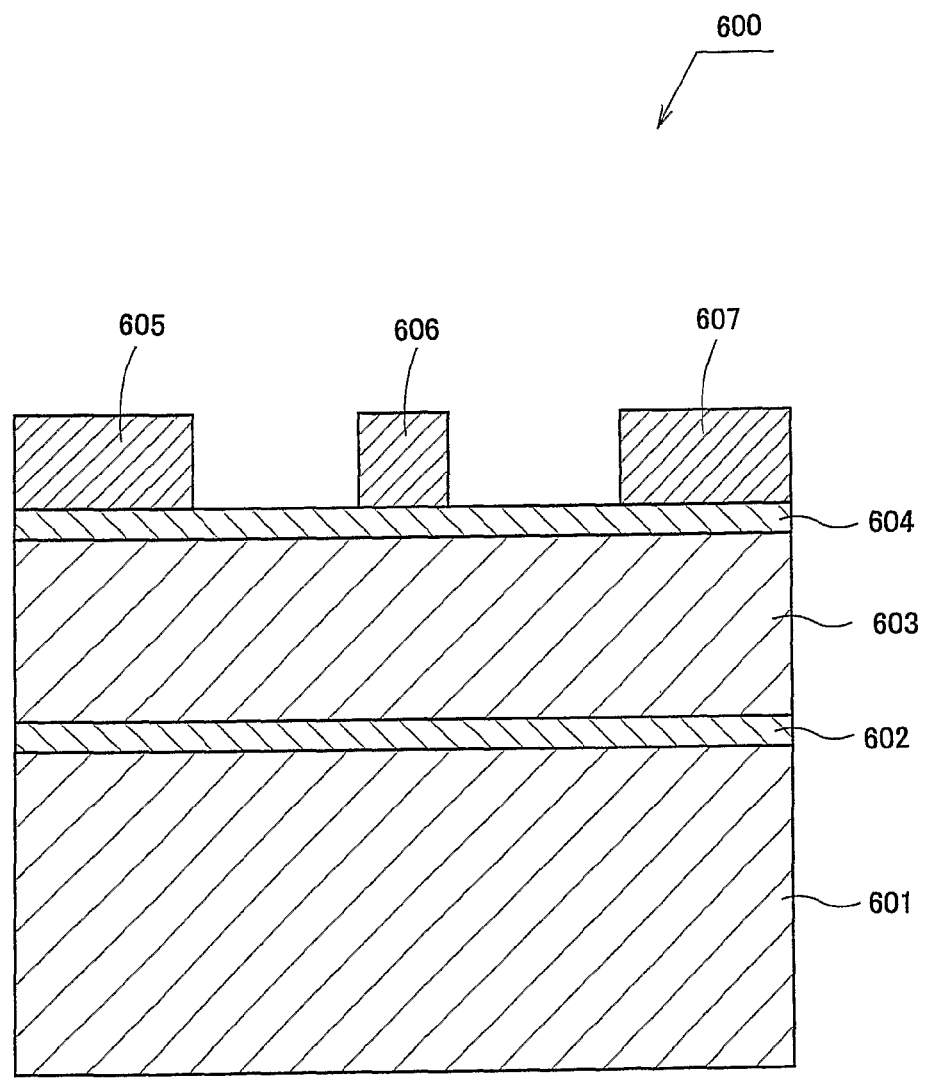
FIG. 18 is a sectional view of a field-effect transistor 600 according to the sixth embodiment of the present invention.

FIG. 18 is a sectional view of a field-effect transistor 600 in the sixth embodiment. The field-effect transistor 600 is a semiconductor device which is formed by depositing Group III nitride compound semiconductor layers in sequence through crystal growth, and a crystal growth substrate 601 is made of silicon carbide (4H—SiC) having thickness of about 500 μm. On the crystal growth substrate 601, about 200 nm in thickness of AlN layer 602 (: lattice constant difference relaxing layer) made of AlN is formed.

On the AlN layer 602, about 2 μm in thickness of undoped GaN semiconductor layer 603 is formed. The semiconductor layer 603 corresponds to a semiconductor layer A in the present invention. Further, on the semiconductor layer 603, about 40 nm in thickness of undoped $Al_{0.25}Ga_{0.75}N$ barrier layer 604 is formed. Thickness of the barrier layer 604 is determined so that tunneling effect of carriers (electrons) from each ohmic electrode (605 and 607) into a channel formed on the interface between the upper surface of the semiconductor layer 603 and the layer 604 become sure and preferable.

Each of 605, 606, and 607 represents a source electrode (ohmic electrode), a gate electrode (Schottky electrode) and a drain electrode (ohmic electrode). Each ohmic electrode (the source electrode 605 and the drain electrode 607) is formed by depositing about 100 Å in thickness of thin metal layer made of titanium (Ti) through vapor deposition and further depositing about 3000 Å in thickness of metal layer made of aluminum (Al) through vapor deposition. These ohmic electrodes excellently adhere with each other and are alloyed through thermal treatment of flash anneal for less than 1 second under temperature from 700° C. to 900° C. The gate electrode 606 is a Schottky electrode which is formed by depositing about 100 Å in thickness of metal layer made of nickel (Ni) through vapor deposition and further depositing about 3000 Å in thickness of metal layer made of gold (Au) through vapor deposition.

A method for manufacturing the field-effect transistor 600 is explained hereinafter, referring to the main characteristic of the present invention (the semiconductor layer 603: the high-resistivity semiconductor layer A).

Each semiconductor layer (the semiconductor layers 602, 603, and 604) in the field-effect transistor 100 is formed through vapor phase crystal growth called metal-organic vapor phase epitaxy (hereinafter abbreviated as MOVPE) The following gasses were employed: a carrier gas ($H_2$ or $N_2$), ammonia gas ($NH_3$), trimethylgallium (Ga ($CH_3$) 3), and trimethylaluminum (Al ($CH_3$) 3).

In the vapor phase growth treatment, at first the crystal growth substrate 601 is baked at 1140° C., and about 200 nm in thickness of AlN nucleus forming layer 602 (: lattice constant difference relaxing layer) is formed on the crystal growth substrate 601 through crystal growth at 1140° C.

Next, about 2 μm in thickness of semiconductor layer 603 made of undoped GaN crystal is formed according to crystal growth conditions as follows.

(Crystal Growth Conditions of the Semiconductor Layer 604)
(1) crystal growth temperature: 1140[° C.]
(2) crystal growth rate: 80 [nm/min]

Next, about 40 nm in thickness of undoped $Al_{0.25}Ga_{0.75}N$ crystal semiconductor layer (buffer layer) 604 is deposited thereon. Crystal growth temperature of that crystal growth is about 1000° C.

The field-effect transistor 600 shown in FIG. 18 manufactured through crystal growth processes described above can be an objective field-effect transistor (HFET) which has high mobility, remarkably excellent electric characteristic and little leak electric current. Such a field-effect transistor (HFET) is very useful in not only improving performance and reliability of the device but also improving miniaturization and integration of the device compared with the conventional device.

Seventh Embodiment

Figure 19:
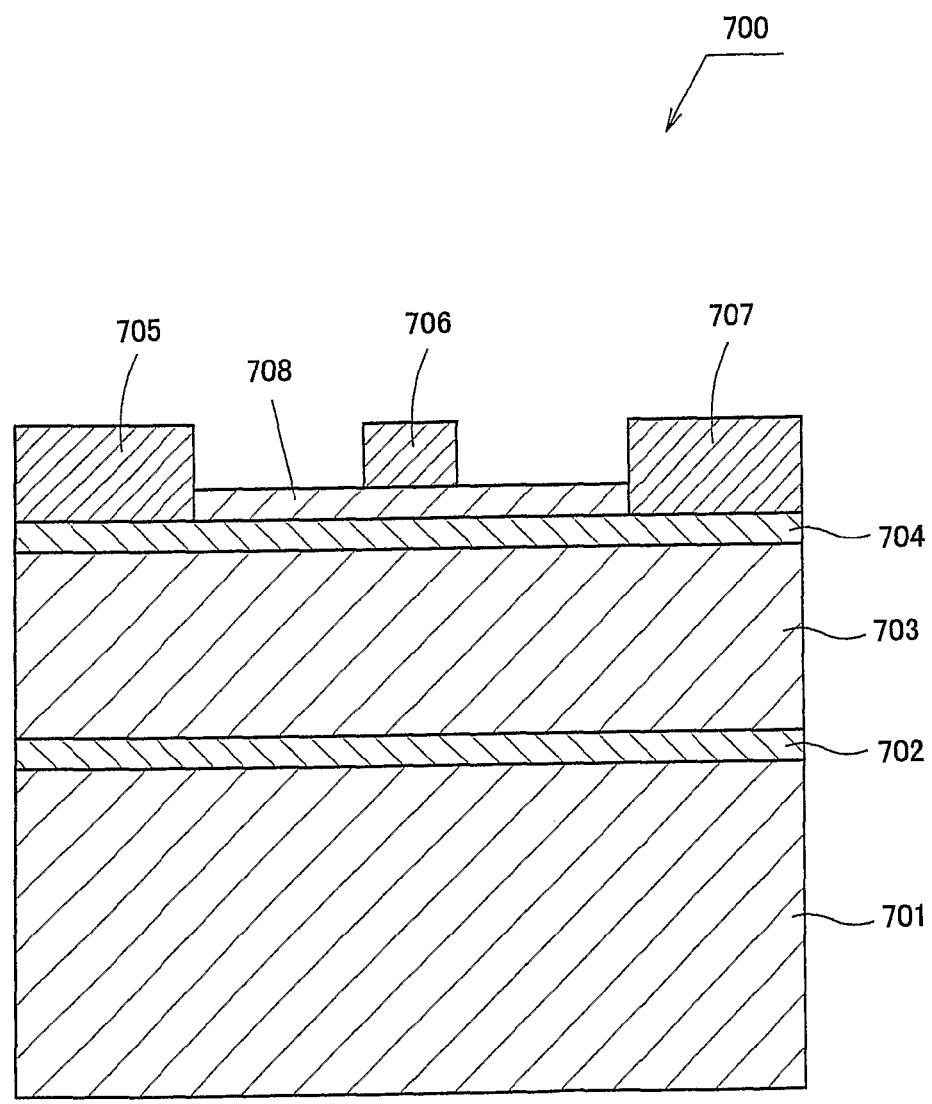
FIG. 19 is a sectional view of a field-effect transistor 700 according to the seventh embodiment of the present invention.

FIG. 19 is a sectional view of a field-effect transistor 700 (MISFET) according to the seventh embodiment of the present invention. The largest difference between the field-effect transistor 700 and the field-effect transistor 600 explained above is that an insulation film 708 made of silicon nitride (SiN) is formed between a gate electrode 706 and a barrier layer 704. Each of other layer (701-707) in the field-effect transistor 700 is formed equivalent to each layer (601-607) in the field-effect transistor 600 explained above.

By employing that structure, the MISFET can obtain actions and effect of the present invention according to the method of the present invention similar to the sixth embodiment. Also, a filed-effect transistor having extremely high gate break down field strength can be obtained.

Other Modified Embodiment

While the present invention has been described with reference to the above embodiments as the most practical and optimum ones, the present invention is not limited thereto, but may be modified as appropriate without departing from the spirit of the invention.

Modified Embodiment 1

For example, in the sixth embodiment, the substrate of the field-effect transistor is made of silicon carbide (SiC). Alternatively, a sapphire substrate may be useful as a crystal growth substrate. When the semiconductor layer 602 and the semiconductor layer 603 in the field-effect transistor shown in FIG. 18 are formed by employing the processes and crystal growth conditions for forming low growth temperature nucleus forming layer 522 and the high-resistivity semiconductor layer 523 in the fifth embodiment, the field-effect transistor 600 can obtain actions and effects of the present invention according to the method of the present invention.

At that time, as disclosed in the sixth embodiment, about 40 nm in thickness of AlN semiconductor layer may preferably be formed at a low temperature of about 400° C. as the nucleus forming layer. As the high-resistivity semiconductor layer A (the semiconductor layer 603 in FIG. 18) comprised in the buffer layer, a undoped GaN crystal layer may preferably be formed to be a thickness of about 2 μm at crystal growth temperature of 1150° C. and crystal growth rate of 90 nm/min.

Modified Example 2

Alternatively, each barrier layer such as the semiconductor layer 604 and the semiconductor layer 704 may be made of InAlN and InAlGaN. These barrier layers can be made of a general Group III nitride compound semiconductor which has necessary and adequately larger band gap energy compared with the buffer layers such as the semiconductor layer 603 and the semiconductor layer 703.

Modified Example 3

Alternatively, in place of those barrier layers, an n-type semiconductor layer can be deposited. For example, in place of the semiconductor layer 604 in FIG. 18, an n-type semiconductor layer can be deposited, which enables to manufacture a MESFET.

In short, even by modifying each embodiment and modified example, each kind of field-effect transistor such as HFET, MISFET, and MESFET can be manufactured.

INDUSTRIAL APPLICABILITY

The present invention is useful for preventing roughness of the surface of the semiconductor. The present invention is to maintain possibility and easiness for miniaturizing the electrode of the semiconductor device. Also, the present invention is useful for mobility of carriers transmitting in the channel which is formed to have approximately flat surface on the interface of the semiconductor layers deposited through crystal growth. The present invention can maintain the mobility of carriers excellently.

Accordingly, the present invention is very useful for designing and manufacturing a field-effect transistor (including each kind of FET and HEMT) which is manufactured through crystal growth of a Group III nitride compound semiconductor. The present invention is useful for miniaturizing and improving performance of each kind of field-effect transistor.

The present invention is useful for effectively improving mobility of two-dimentional electric gas in the channel layer which is formed to have approximately flat surface on the interface of the semiconductor layers deposited through crystal growth. So the present invention is very useful for designing and manufacturing a field-effect transistor (including each kind of FET and HEMT) which is manufactured through crystal growth of a Group III nitride compound semiconductor.

Further, the present invention is useful for the undoped semiconductor layer (high-resistivity semiconductor layer A) in the present invention, which has high resistivity and excellent insulation, to provide extremely high insulation without being influenced by any impurity. Accordingly, the present invention can be applied not only to a field-effect transistor such as FET and HEMT but also to a light-emitting semiconductor device such as a semiconductor laser and a LED, a light-receiving semiconductor device, a pressure sensor, and any kind of other semiconductor device.

The invention claimed is:
1. A method for manufacturing a field-effect transistor which comprises a buffer layer and a barrier layer each of which comprises a Group III nitride compound semiconductor and has a channel at an interface side of said buffer layer of said barrier layer, said method comprising:
crystal growth process for crystal growing said barrier layer,
wherein a partial pressure ratio R of hydrogen ($H_2$) gas in a carrier gas which carries a material gas of said barrier layer decreases substantially monotonously with respect to a time t in a region represented by a formula $r_1 \geq R \geq r_2$ ($1 \geq r_1 > 1/4$, $1/2 > r_2 \geq 0$, $r_1 > r_2$).

2. The method for manufacturing a field-effect transistor according to claim 1, wherein said barrier layer comprises m+1 semiconductor layers in total. each of which comprises an undoped $Al_xGa_{1-x}N$ ($0<x\leqq1$) by decreasing said partial pressure ratio R of the gas gradually for m times ($m \geqq 1$) in said crystal growth process.

3. The method for manufacturing a field-effect transistor according to claim 2, wherein said barrier layer includes a two-layer structure, comprising a first layer of said barrier layer deposited first, which is grown through crystal growth by using hydrogen ($H_2$) gas as a main carrier gas, and a second layer of said barrier layer deposited thereon, which is grown through crystal growth by using a rare gas or an inert gas comprising nitrogen ($N_2$) gas as a main carrier gas.

\* \* \* \* \*

UNITED STATES PATENT AND TRADEMARK OFFICE
CERTIFICATE OF CORRECTION

| | | |
|---|---|---|
| PATENT NO. | : 7,981,744 B2 | Page 1 of 1 |
| APPLICATION NO. | : 11/578965 | |
| DATED | : July 19, 2011 | |
| INVENTOR(S) | : Masayoshi Kosaki et al. | |

It is certified that error appears in the above-identified patent and that said Letters Patent is hereby corrected as shown below:

AMENDMENT TO THE CLAIM

Col. 29, line 3:
    Replace the "." for a ",":
    --In total, each of--

Signed and Sealed this
Fourth Day of October, 2011

David J. Kappos
*Director of the United States Patent and Trademark Office*